(12) United States Patent
Liu et al.

(10) Patent No.: US 10,174,246 B2
(45) Date of Patent: *Jan. 8, 2019

(54) RED-EMITTING NITRIDE-BASED CALCIUM-STABILIZED PHOSPHORS

(71) Applicant: Intematix Corporation, Fremont, CA (US)

(72) Inventors: Shengfeng Liu, Fremont, CA (US); Yi-Qun Li, Danville, CA (US); Ka Y. Leung, Sacramento, CA (US); Dejie Tao, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 15/044,880

(22) Filed: Feb. 16, 2016

(65) Prior Publication Data

US 2016/0264863 A1    Sep. 15, 2016

Related U.S. Application Data

(63) Continuation of application No. 14/095,766, filed on Dec. 3, 2013, now Pat. No. 9,260,659, which is a
(Continued)

(51) Int. Cl.
*H01L 33/00* (2010.01)
*C09K 11/59* (2006.01)
(Continued)

(52) U.S. Cl.
CPC ...... *C09K 11/7734* (2013.01); *C09K 11/0883* (2013.01); *C09K 11/7728* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 3,207,583 | A | 9/1965 | Brautigam et al. |
| 6,649,946 | B2 | 11/2003 | Bogner et al. |

(Continued)

FOREIGN PATENT DOCUMENTS

| | | | |
|---|---|---|---|
| CN | 101157854 A | 4/2008 | |
| CN | 101595201 A | 12/2009 | |

(Continued)

OTHER PUBLICATIONS

Search Report and Written Opinion issued in PCT/US2012/072336 on Apr. 22, 2013.
(Continued)

*Primary Examiner* — C Melissa Koslow

(57) ABSTRACT

Red-emitting phosphors may comprise a nitride-based composition represented by the chemical formula $M_aSr_bSi_cAl_dN_eEu_f$, wherein: M is at least one of Mg, Ca, Sr, Ba, Y, Li, Na, K and Zn, and $0<a<1.0$; $1.5<b<2.5$; $4.0 \le c \le 5.0$; $0 \le d \le 1.0$; $7.5<e<8.5$; and $0<f<0.1$; wherein $a+b+f>2+d/v$ and v is the valence of M. Furthermore, nitride-based red-emitting phosphor compositions may be represented by the chemical formula $M_xM'_2Si_{5-y}Al_yN_8$:A, wherein: M is Mg, Ca, Sr, Ba, Y, Li, Na, K and Zn, and $x>0$; M' is at least one of Mg, Ca, Sr, Ba, and Zn; $0 \le y \le 0.15$; and A is at least one of Eu, Ce, Tb, Pr, and Mn; wherein $x>y/v$ and v is the valence of M, and wherein the red-emitting phosphors have the general crystalline structure of $M'_2Si_5N_8$:A.

15 Claims, 34 Drawing Sheets

Related U.S. Application Data continuation of application No. 13/922,231, filed on Jun. 19, 2013, now Pat. No. 8,597,545, which is a continuation-in-part of application No. 13/871,961, filed on Apr. 26, 2013, now Pat. No. 8,663,502.

(60) Provisional application No. 61/673,191, filed on Jul. 18, 2012.

(51) Int. Cl.
  C09K 11/77 (2006.01)
  C09K 11/08 (2006.01)
  H05B 33/12 (2006.01)
  H05B 33/14 (2006.01)
  H01L 33/32 (2010.01)
  H01L 33/50 (2010.01)
  H01L 33/56 (2010.01)
  H01L 33/62 (2010.01)

(52) U.S. Cl.
  CPC ......... C09K 11/7731 (2013.01); H01L 33/32 (2013.01); H01L 33/504 (2013.01); H01L 33/507 (2013.01); H01L 33/56 (2013.01); H01L 33/62 (2013.01); H05B 33/12 (2013.01); H05B 33/14 (2013.01); H01L 33/50 (2013.01); H01L 2224/48091 (2013.01); H01L 2224/48247 (2013.01); H01L 2224/49107 (2013.01); H01L 2224/73265 (2013.01)

(56) References Cited

U.S. PATENT DOCUMENTS

| | | | |
|---|---|---|---|
| 6,670,748 B2 | 12/2003 | Ellens et al. | |
| 6,956,247 B1 | 10/2005 | Stockman | |
| 7,026,755 B2 | 4/2006 | Setlur et al. | |
| 7,138,756 B2 | 11/2006 | Gotoh et al. | |
| 7,229,573 B2 | 6/2007 | Setlur et al. | |
| 7,252,787 B2 | 8/2007 | Hancu et al. | |
| 7,252,788 B2 | 8/2007 | Nagatomi et al. | |
| 7,258,816 B2 | 8/2007 | Tamaki et al. | |
| 7,311,858 B2 | 12/2007 | Wang et al. | |
| 7,345,418 B2 | 3/2008 | Nagatomi et al. | |
| 7,476,337 B2 | 1/2009 | Sakane et al. | |
| 7,476,338 B2 | 1/2009 | Sakane et al. | |
| 7,507,354 B2 | 3/2009 | Oshio | |
| 7,537,710 B2 | 5/2009 | Oshio | |
| 7,540,977 B2 | 6/2009 | Hirosaki et al. | |
| 7,556,744 B2 | 7/2009 | Tamaki et al. | |
| 7,575,679 B2 | 8/2009 | Sumino et al. | |
| 7,597,823 B2 | 10/2009 | Tamaki et al. | |
| 7,854,859 B2 | 12/2010 | Kameshima et al. | |
| 8,062,549 B2 | 11/2011 | Nagatomi et al. | |
| 8,153,025 B2 | 4/2012 | Schmidt et al. | |
| 8,178,001 B2 | 5/2012 | Kaneda et al. | |
| 8,597,545 B1* | 12/2013 | Liu ..................... | C09K 11/0883 252/301.4 F |
| 8,663,502 B2* | 3/2014 | Tao ..................... | C09K 11/0883 252/301.4 F |
| 8,951,441 B2 | 2/2015 | Li et al. | |
| 2005/0189863 A1 | 9/2005 | Nagatomi et al. | |
| 2006/0017365 A1 | 1/2006 | Nagatomi et al. | |
| 2006/0027786 A1 | 2/2006 | Dong et al. | |
| 2006/0145123 A1 | 7/2006 | Cheng et al. | |
| 2006/0255710 A1 | 11/2006 | Mueller/Mach et al. | |
| 2007/0007494 A1 | 1/2007 | Hiosaki et al. | |
| 2007/0029526 A1 | 2/2007 | Cheng et al. | |
| 2007/0040152 A1 | 2/2007 | Oshio | |
| 2007/0182309 A1 | 8/2007 | Wang et al. | |
| 2007/0257596 A1 | 11/2007 | Shimomura et al. | |
| 2008/0001126 A1 | 1/2008 | Hirosaki | |
| 2008/0081011 A1 | 4/2008 | Oshio | |
| 2008/0116786 A1 | 5/2008 | Wang et al. | |
| 2008/0128726 A1 | 6/2008 | Sakata et al. | |
| 2008/0143246 A1 | 6/2008 | Hirosaki et al. | |
| 2008/0303409 A1 | 12/2008 | Hirosaki et al. | |
| 2009/0114929 A1 | 5/2009 | Lee et al. | |
| 2009/0166584 A1 | 7/2009 | Shimooka et al. | |
| 2009/0243467 A1 | 10/2009 | Shimizu et al. | |
| 2009/0283721 A1 | 11/2009 | Liu et al. | |
| 2009/0309112 A1 | 12/2009 | Yoshimatsu | |
| 2010/0044729 A1 | 2/2010 | Naum et al. | |
| 2010/0288972 A1 | 11/2010 | Roesler et al. | |
| 2011/0176084 A1 | 7/2011 | Akiho et al. | |
| 2013/0092964 A1 | 4/2013 | Li et al. | |
| 2013/0127332 A1 | 5/2013 | Chen et al. | |

FOREIGN PATENT DOCUMENTS

| | | |
|---|---|---|
| CN | 101798510 A | 8/2010 |
| CN | 102433114 A | 5/2012 |
| CN | 104583365 B | 5/2016 |
| EP | 1568753 A2 | 8/2005 |
| EP | 1837386 A1 | 9/2007 |
| EP | 1873225 | 1/2008 |
| EP | 1884552 | 2/2008 |
| EP | 1887067 | 2/2008 |
| EP | 2009077 | 12/2008 |
| EP | 2058382 | 5/2009 |
| EP | 2471890 | 7/2012 |
| JP | 2003124527 A | 4/2003 |
| JP | 2004/244560 | 9/2004 |
| JP | 2005/226000 A | 8/2005 |
| JP | 2007169428 A | 7/2007 |
| JP | 2008/163259 A | 7/2008 |
| JP | 4543251 | 7/2010 |
| JP | 2012/046626 A | 3/2012 |
| JP | 2012/069572 | 4/2012 |
| JP | 2012/114333 A | 6/2014 |
| KR | 10/2010/0086964 | 8/2010 |
| WO | WO2010131133 A1 | 11/2010 |

OTHER PUBLICATIONS

Ruan, J., et al., "Nitrogen Gas Pressure Synthesis and Photoluminescent Properties of Orange/Red SrALSi4N7:Eu2+ Phosphors for White Light Emitting Diodes", J. Am. Ceram. Soc, 94(2), 2011, pp. 536/542.

Shioi, K., et al., "Synthesis Crystal Structure and Photoluminescence of Sr/α/SiA1ON:Eu$^{2+}$", J. Am. Ceramic Soc., 93(2), 2010, pp. 465/469.

Hecht, Cora "SrALS14N7:EU2+ / a Nitridoaluminosilicate Phosphor for Warm White Light . . . ", Chem. Mater, 21, 2009, pp. 1595/1601.

Paio, X., et al., "Synthesis and Luminescent Properties of Low Oxygen Contained Eu$^{2+}$ /doped Ca/α/SiAlON Phosphor from Calcium Cyanamide Reduction", Journal of Rare Earths, 26(2), Apr. 2008, pp. 198/202.

Xie, Rong/Jun et al., "Silcon/based oxynitride and nitride phosphors for white LEDs—a review," Science and Technology of Advanced Materials, Oct. 23, 2007, pp. 588/600, vol. 8.

Hampshire, et al., "Silicon Nitride Ceramics/Review of Structure, Processing and Properties," Journal of Achievements in Mats. and Manufacturing Engineering, 24(1), Sep. 2007, pp. 43/50.

Xie, et al., "A Simple, Efficient Synthetic Route to $Sr_2Sl_5N_8$:Eu$^{2+}$ /based Red Phosphors for White Light/Emitting Diodes", Chem. Mater., 18, 2006, pp. 5578/5583.

Uheda, K. et al., "Luminescence properties of a red phosphor, $CaAlSiN_3$: Eu$^{2+}$, for white light/emitting diodes," Electrochemical and Solid/State Letters, 2006, pp. H22/H25, vol. 9, No. 4.

Paio, X., et al., "Preparation of $(Sr_{1/x}Ca_x)_2Si_5N_8$/Eu$^{2+}$ Solid Solutions and Their Luminescence Properties," J. Electrochem. Soc. 2006, vol. 153, Issue 12, pp. H232/H235.

Li et al., "Luminescence properties of red/emitting $M_2Si_5N_8$:Eu$^{2+}$ (M=Ca, Sr, Ba) LED conversion phosphors," J. of Alloys and Compounds, 2006, pp. 273/279, vol. 417.

Hoppe, A., et al., "Luminescence in Eu$^{2+}$ /doped $Ba_2Si_5N_8$: Fluorescence, Thermoluminescence, and Upconversion", J. of Phys. Chem. Solids, vol. 61, 2000, pp. 2001/2006.

(56) References Cited

OTHER PUBLICATIONS

Van Krevel, J.W.H., On New Rare/Earth Doped M/Si/Al/O/N Materials: Luminescence Properties and Oxidation Resistance, Thesis, Chapters 1/3, 2000, pp. 1/43.
Huang, et al., "Formation of $\alpha/Si_3N_4$ Solid Solutions in the System $Si_3N_4/AlN/Y_2O_3$", Comm. of the American Cerm. Soc., Jun. 1983, C96-C97.
Hampshire, "α/Sialon Ceramics", Nature, vol. 274, Aug. 31, 1978, pp. 880/882.

\* cited by examiner

SECTION A-A

RED-EMITTING NITRIDE-BASED CALCIUM-STABILIZED PHOSPHORS

CROSS-REFERENCE TO RELATED APPLICATIONS

This application is a continuation of U.S. patent application Ser. No. 14/095,766 filed Dec. 3, 2013 (now U.S. Pat. No. 9,260,659), which is a continuation of U.S. patent application Ser. No. 13/922,231 filed Jun. 19, 2013 (now U.S. Pat. No. 8,597,545), which is a continuation-in-part of U.S. patent application Ser. No. 13/871,961 filed Apr. 26, 2013 (now U.S. Pat. No. 8,663,502), and claims the benefit of U.S. Provisional Patent Application Ser. No. 61/673,191 filed Jul. 18, 2012. The disclosures of the aforementioned applications are all incorporated by reference in their entirety herein.

FIELD OF THE INVENTION

Embodiments of the present invention are directed to red-emitting nitride-based phosphor compositions.

BACKGROUND OF THE INVENTION

Many of the red-emitting phosphors are derived from silicon nitride ($Si_3N_4$). The structure of silicon nitride comprises layers of Si and N bonded in a framework of slightly distorted $SiN_4$ tetrahedra. The $SiN_4$ tetrahedra are joined by a sharing of nitrogen corners such that each nitrogen is common to three tetrahedra. See, for example, S. Hampshire in "Silicon nitride ceramics—review of structure, processing, and properties," *Journal of Achievements in Materials and Manufacturing Engineering*, Volume 24, Issue 1, September (2007), pp. 43-50. Compositions of red-emitting phosphors based on silicon nitride often involve substitution of the Si at the center of the $SiN_4$ tetrahedra by elements such as Al; this is done primarily to modify the optical properties of the phosphors, such as the intensity of the emission, and the peak emission wavelength.

There is a consequence of the aluminum substitution, however, which is that since $Si^{4+}$ is being replaced by $Al^{3+}$, the substituted compound develops a missing positive charge. There are essentially two ways commonly employed to achieve charge balance: in one scheme, an $Al^{3+}$ for $Si^{4+}$ substitution is accompanied by a substitution of $O^{2-}$ for $N^{3-}$, such that the missing positive charge is counter-balanced with a missing negative charge. This leads to a network of tetrahedra that have either $Al^{3+}$ or $Si^{4+}$ as the cations at the centers of the tetrahedra, and a structure whereby either an $O^{2-}$ or an $N^{3-}$ anion is at the corners of the tetrahedra. Since it is not known precisely which tetrahedra have which substitutions, the nomenclature used to describe this situation is $(Al,Si)_3$—$(N,O)_4$. Clearly, for charge balance there is one O for N substitution for each Al for Si substitution.

Furthermore, these substitutional mechanisms for charge balance—O for N—may be employed in conjunction with an interstitial insertion of a cation. In other words, the modifying cation is inserted between atoms preexisting on crystal lattice sites, into "naturally occurring" holes, interstices, or channels. This mechanism does not require an altering of the anionic structure (in other words, a substitution of O for N), but this is not to say that an O for N substitution may not simultaneously occur. Substitutional mechanisms for charge balance may occur in conjunction with an interstitial insertion of a modifier cation.

The use of modifying cations in nitride phosphors of Sr-containing α-SiAlON has been discussed by K. Shioi et al. in "Synthesis, crystal structure, and photoluminescence of Sr-α-SiAlON:$Eu^{2+}$," *J. Am. Ceram. Soc.*, 93 [2] 465-469 (2010). Shioi et al. give the formula for the overall composition of this class of phosphors: $M_{m/v}Si_{12-m-n}Al_{m+n}O_nN_{16-n}:Eu^{2+}$, where M is a "modifying cation" such as Li, Mg, Ca, Y, and rare earths (excluding La, Ce, Pr, and Eu), and v is the valence of the M cation. As taught by Shioi et al., the crystal structure of an α-SiAlON is derived from the compound α-$Si_3N_4$. To generate an α-SiAlON from α-$Si_3N_4$, a partial replacement of $Si^{4+}$ ions by $Al^{3+}$ ions takes place, and to compensate for the charge imbalance created by $Al^{3+}$ substituting for $Si^{4+}$, some O substitutes N and some positive charges are added by trapping the M cations into the interstices within the network of (Si,Al)—$(O,N)_4$ tetrahedra.

Europium doped alkaline earth metal silicon nitride phosphor with the general formula $M_2Si_5N_8$:Eu, where M is Ca, Sr, or Ba, have been widely studied, see for example the PhD thesis by JWH van Krevel at the Technical University Eindhoven, January 2000, and H. A. Hoppe, et al., J. Phys. Chem. Solids. 2000, 61:2001-2006. In this family of phosphors, pure $Sr_2Si_5N_8$:Eu has high quantum efficiency and emits at a peak wavelength of about 620 nm. However, this red nitride phosphor has poor stability when used as a coating on an LED operated at a temperature in the range from 60° C. to 120° C. and an ambient relative humidity in the range from 40% to 90%.

Various research groups have experimented with oxygen-containing $M_2Si_5N_8$ based phosphor materials, which may also contain other metals. For example, see U.S. Pat. Nos. 7,671,529 and 6,956,247, and U.S. published applications 2010/0288972, 2008/0081011, and 2008/0001126. However, these oxygen containing phosphor materials are known to exhibit poor stability under the combined conditions of high temperature and high relative humidity (RH)—for example 85° C. and 85% RH.

The forms of charge compensation reported in the art are not believed to render the phosphor more impervious to thermal/humidity aging, nor do they appear to accomplish the beneficial result of increasing the peak emission wavelength with little or substantially no alteration of photoemission intensity.

There is a need for silicon nitride-based phosphors and $M_2Si_5N_8$-based phosphors with peak emission wavelengths over a wider range in the red and also other colors, and with enhanced physical properties of the phosphor, such as temperature and humidity stability.

SUMMARY OF THE INVENTION

Embodiments of the present invention may provide {Mg, Ca, Sr, Ba, Y, Li, Na, K, and/or Zn}-stabilized, particularly Ca-stabilized, nitride-based phosphors with chemical composition based on $M_2Si_5N_8$ with and without column IIIB elements, particularly Al, substituting for Si. The stabilizing cations may be (1) incorporated into the phosphor crystal structure for charge balance for column IIIB element substitution, when used to substitute for Si, and (2) incorporated into the phosphor in excess of any need for charge balancing the substitution of Si by a column IIIB element. These phosphor materials may be configured to extend the peak emission wavelength to longer wavelengths in the red, and to enhance physical properties of the phosphor—notably, significant improvement of the temperature and humidity stability.

Some embodiments of the present invention are directed to a red-emitting phosphor which may comprise a nitride-based composition represented by the chemical formula $M_xM'_2Si_{5-y}Al_yN_8:A$, wherein: M is at least one of Mg, Ca, Sr, Ba, Y, Li, Na, K and Zn, where v is the valence of M, and x>0; M' is at least one of Mg, Ca, Sr, Ba, and Zn; y satisfies $0 \leq y \leq 1.0$; and activator A is at least one of Eu, Ce, Tb, Pr, Sm and Mn, wherein x>y/v. Furthermore, the red-emitting phosphor may have the general crystalline structure of $M'_2Si_5N_8:A$. Yet furthermore, Al may substitute for Si within the general crystalline structure and M may be located within the general crystalline structure substantially at interstitial sites. Furthermore, the red-emitting phosphor may comprise at least one of F, Cl, Br and O. Yet furthermore, M may be Ca, y=0 and $0.1 \leq x \leq 0.4$. Furthermore, M may be Ca, $0.1 \leq y \leq 0.15$ and $0.1 \leq x \leq 0.4$.

Some embodiments of the present invention are directed to a red-emitting phosphor which may comprise a nitride-based composition represented by the chemical formula $M_aSr_bSi_cAl_dN_eEu_f$, wherein: M is at least one of Mg, Ca, Sr, Ba, Y, Li, Na, K and Zn, and $0<a<1.0$; $1.5<b<2.5$; $4.0 \leq c \leq 5.0$; $0 \leq d \leq 1.0$; $7.5<e<8.5$; and $0<f<0.1$; wherein a+b+f>2+d/v and v is the valence of M. Furthermore, the red-emitting phosphor may comprise at least one of F, Cl, Br and O. Yet furthermore, M may be Ca, d=0 and $0.1 \leq a \leq 0.4$. Furthermore, M may be Ca, $0.1 \leq d \leq 0.15$ and $0.1 \leq a \leq 0.4$.

The addition of interstitial Ca to an aluminum substituted $M'_2Si_5N_8$ red-emitting phosphor, beyond any need for charge balancing for the substitution of Si by Al, has the unexpected benefit that the stability of the phosphor is enhanced under conditions of aging at elevated temperature and humidity. In some embodiments, the phosphor may be compositionally configured such that after 800 hours of aging at 85° C. and 85% relative humidity the drop in photoluminescent intensity is no greater than about 15%, in embodiments no greater than about 10%, and the deviation in chromaticity coordinates CIE $\Delta x$ and CIE $\Delta y$ is less than or equal to about 0.015 for each coordinate, in embodiments less than or equal to about 0.010 for each coordinate, and in further embodiments less than or equal to about 0.005 for each coordinate.

Furthermore, the addition of Ca to a $M'_2Si_5N_8$ red-emitting phosphor has the unexpected benefit that the stability of the phosphor is enhanced under conditions of aging at elevated temperature and humidity. In some embodiments, the phosphor may be compositionally configured such that after 500 hours of aging at 85° C. and 85% humidity the drop in photoluminescent intensity is no greater than about 50%, in embodiments no greater than about 35%, and the deviation in chromaticity coordinates CIE $\Delta x$ and CIE $\Delta y$ is less than or equal to about 0.065 for each coordinate, and in embodiments less than or equal to about 0.045 for each coordinate.

According to the present embodiments, the phosphor, under blue excitation, may be configured to emit light having a peak emission wavelength greater than about 620 nm, in embodiments greater than 623 nm, and in further embodiments greater than about 626 nm, where blue may be defined as light having a wavelength ranging from about 420 nm to about 470 nm. The present phosphors may also be excited by radiation having shorter wavelengths; e.g., from about 200 nm to about 420 nm, but when the excitation radiation is in the x-ray or UV, a separate blue-emitting phosphor is provided to contribute a blue component to the desired white light for a white light source. Furthermore, the present phosphors may also be excited by radiation having longer wavelengths, wherein the wavelength ranges from about 200 nm to about 550 nm. A common blue excitation source is an InGaN LED, or GaN LED, emitting with a peak at about 465 nm.

Embodiments of the present invention also include white light emitting device comprising a solid state excitation source and any of the red-emitting phosphors described herein. It may also include a yellow-emitting phosphor and/or a green-emitting phosphor with a peak emission wavelength in the range from about 500 nm to about 580 nm. An exemplary red-emitting phosphor according to embodiments of the present invention is $Eu_{0.05}Ca_{0.1}Sr_{1.95}Si_{4.88}Al_{0.12}N_8$.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 7A is the change in photoluminescent intensity (brightness) with time, FIG. 7B is the change in CIE x chromaticity coordinate with time, and FIG. 7C is the change in CIE y chromaticity coordinate with time, according to some embodiments of the present invention;

FIG. 8A is the change in photoluminescent intensity (brightness) with time, FIG. 8B is the change in CIE x chromaticity coordinate with time, and FIG. 8C is the change in CIE y chromaticity coordinate with time, according to some embodiments of the present invention, and reliability data for prior art red-emitting nitride-based 2-5-8 phosphor Sample 1 is shown for comparison;

FIG. 9A is the change in photoluminescent intensity (brightness) with time, FIG. 9B is the change in CIE x chromaticity coordinate with time, and FIG. 9C is the change in CIE y chromaticity coordinate with time, according to some embodiments of the present invention, and reliability data for prior art red-emitting nitride-based 2-5-8 phosphor Sample 1 is shown for comparison;

FIG. 10A is the change in photoluminescent intensity (brightness) with time, FIG. 10B is the change in CIE x chromaticity coordinate with time, and FIG. 10C is the change in CIE y chromaticity coordinate with time, according to some embodiments of the present invention;

DETAILED DESCRIPTION OF THE INVENTION

Figure 1:
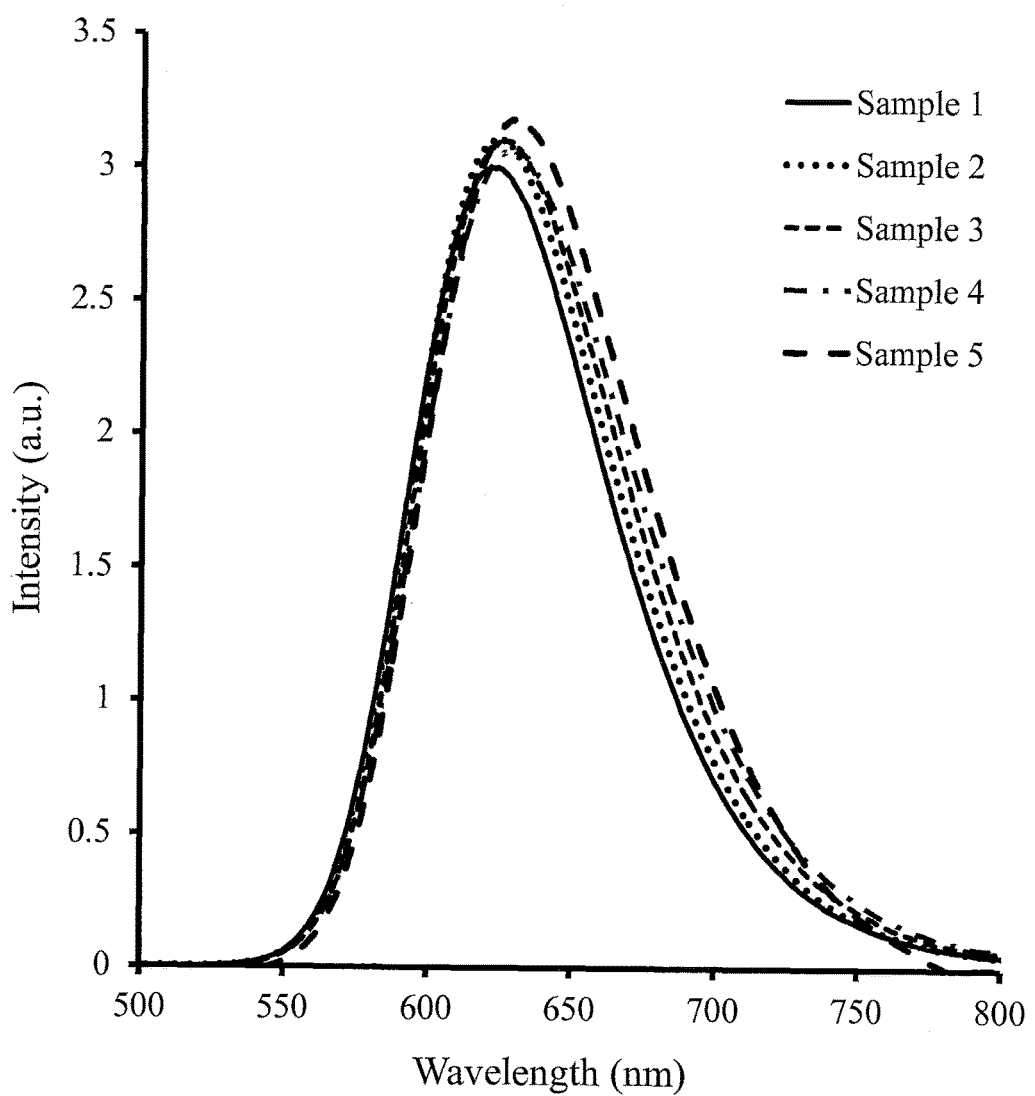
FIG. 1 shows emission spectra of the red-emitting nitride-based calcium-stabilized phosphors Samples 2 through 5, according to some embodiments of the present invention, and Sample 1 is a prior art red-emitting nitride-based 2-5-8 phosphor shown for comparison.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Some embodiments of the present invention are directed to a red-emitting phosphor which may comprise a nitride-based composition represented by the chemical formula $M_xM'_2Si_{5-y}Al_yN_8$:A, wherein: M is at least one of Mg, Ca, Sr, Ba, Y, Li, Na, K and Zn, and x>0; M' is at least one of Mg, Ca, Sr, Ba, Y, Li and Zn; $0 \le y \le 1.0$; and A is at least one of Eu, Ce, Tb, Pr, Sin and Mn; wherein x>y/v and v is the valence of M—the latter reflecting the presence of an excess of M for stabilization of the phosphor and a larger amount of M than needed for charge balance of any Al substituting for Si. Furthermore, the red-emitting phosphor may comprise at least one of F, Cl, Br and O. Yet furthermore, the red-emitting phosphor may have the general crystalline structure of $M'_2Si_5N_8$:A; although embodiments of the red-emitting phosphor may exist with other crystalline structures. Furthermore, Al may substitute for Si within the general crystalline structure and M may be located within the general crystalline structure substantially at interstitial sites.

According to some further embodiments of the present invention, nitride-based calcium-stabilized phosphors may have a composition given by the formula $Ca_xSr_2Si_{5-y}Al_yN_8$ where x>0 and $0 \le y \le 1$, wherein the Ca is present in an amount greater than is required to charge balance the substitution of Si by Al, in other words where 2x>y, and wherein the phosphors exhibit good stability under heat and humidity, as specified herein.

According to further embodiments of the present invention, a red-emitting phosphor may comprise a nitride-based composition represented by the chemical formula $M_aSr_bSi_cAl_dN_eEu_f$, wherein: M is at least one of Mg, Ca, Sr, Ba, Y Li, Na, K and Zn, and $0<a<1.0$; $1.5<b<2.5$; $4.0 \le c \le 5.0$; $0 \le d \le 1.0$; $7.5<e<8.5$; and $0<f<0.1$; wherein a+b+f>2+d/v and v is the valence of M—the latter reflecting the presence of an excess of M for stabilization of the phosphor and a larger amount of M than needed for charge balance of any Al substituting for Si. Furthermore, the red-emitting phosphor may comprise at least one of F, Cl, Br and O. Yet furthermore, M may be Ca, d=0 and $0.1 \le a \le 0.4$, and in some embodiments M may be Ca, d=0 and $0.15 \le a \le 0.25$. Furthermore, M may be Ca, $0.1 \le d \le 0.15$ and $0.1 \le a \le 0.4$, and in some embodiments M may be Ca, $0.1 \le d \le 0.15$ and $0.15 \le a \le 0.25$.

Some embodiments of the present invention are directed to a nitride-based phosphor composition represented by the general formula $M_xM'_2A_{5-y}D_yE_8$:A, where M is a modifier cation. Advantages of the modification to the 2-5-8 phosphor include an increase in peak emission wavelength towards the deep red end of the spectrum, and an enhanced stability in elevated thermal and humidity conditions.

M is at least one of a 1+ cation, a 2+ cation, and a 3+ cation, and M' is at least one of Mg, Ca, Sr, Ba, and Zn, used either individually or in combinations. A is at least one of C, Si and Ge, used either individually or in combinations. The element D replaces the A component substitutionally, where D is selected from the group consisting of column IIIB elements of the periodic table of elements. (The labeling of the columns of the periodic table in this disclosure follow the old IUPAC (International Union of Pure and Applied Chemistry) system. See http://en.wikipedia.org/wiki/Group_(periodic_table), last viewed Jan. 15, 2013.) In one embodiment, D is at least one of B, Al, and Ga, used either individually or in combinations. E in the general formula of the present phosphor is at least one of a 3− anion, a 2− anion, and a 1− anion. Specifically, E may be at least one of $O^{2-}$, $N^{3-}$, $F^{1-}$, $Cl^{1-}$, $Br^-$, and $I^-$, used either individually or in combinations. The activator, A, is at least one of Eu, Ce, Tb, Pr, Sm and Mn. Herein "A" represents a phosphor activator and the notation ":A" represents doping by a rare earth and/or Mn which is generally substitutional, but may also include doping at grain boundaries, on particle surfaces and in interstitial sites within the crystalline structure of the phosphor material. The parameter y is given by $0 \leq y \leq 1.0$ and the value of the parameter x may be defined as being greater than the value of y divided by the valence of M, such that M is present in an amount greater than required for charge balance of any substitution of A by D.

The modifier cation M is added to the phosphor in an amount which is greater than is required to charge compensate for the substitution of D for A. Specifically, M may be at least one of $Li^{1+}$, $Na^{1+}$, $K^{1+}$, $Sc^{3+}$, $Mg^{2+}$, $Ca^{2+}$, $Sr^{2+}$, $Ba^{2+}$, $Zn^{2+}$, $B^{3+}$ and $Y^{3+}$, used either individually or in combinations. M is an extra cation, utilized in addition to the stoichiometric amount of the divalent metal M' in the formula $M'_2Si_5N_8$, and as such, it is expected that this modifier cation might be inserted into the phosphor substantially interstitially, although M may occupy other positions within the host lattice.

Interstitial sites are cavities, holes, or channels that exist in the crystalline lattice by virtue of the manner in which the host's constituent atoms are arranged (packed, or stacked). Dopant atoms that occupy the interstices of a crystal are to be distinguished from such atoms introduced substitutionally; in this latter mechanism, the dopant atoms replace host atoms residing on crystal lattice sites. Support for the proposed interstitial placement of modifier cations within the structure of the phosphor material is found in the literature for ceramic materials with an α-silicon nitride crystal structure. For example, see Hampshire et al. "α'-Sialon ceramics", Nature 274, 880 (1978) and Huang et al. "Formation of α-$Si_3N_4$ Solid Solutions in the System $Si_3N_4$—AlN—$Y_2O_3$" J. Amer. Ceram. Soc. 66 (6), C-96 (1983). These articles state that it is known that the α-silicon nitride unit cell contains two interstitial sites large enough to accommodate other atoms or ions. Furthermore, the α'-sialon structure is derived from the α-silicon nitride structure by partial replacement of Si with Al, and valency compensation is effected by cations—such as Li, Ca, Mg and Y—occupying the interstices of the (Si, Al)—N network, and also by oxygen replacing nitrogen when an oxide is used. (The α'-sialon structure is represented by $M_x(Si, Al)_{12}(O, N)_{16}$, where x is not greater than 2.) Yet furthermore, it is accepted that the a r-sialon structure requires the equivalent of at least half a cationic valency in each of the two interstices within the unit cell to stabilize the structure.

Generally, the crystalline structures of the 2-5-8 nitride-based compounds as described herein may have a space group selected from $Pmn2_1$, Cc, derivatives thereof, or mixtures thereof. In some examples, the space group is $Pmn2_1$. Furthermore, it should be noted that in materials science theory the vacancy density of a pure crystalline material may be on the order of a hundred parts per million of the existing lattice sites depending on the thermal equilibrium conditions of the crystal. As such, a small percentage of the modifier ions, M, may end up in vacant metal ion sites, rather than the interstitial sites—the modifier ions filling the vacancies before the interstitial sites.

Furthermore, the modifier ions may also be involved in charge balancing to compensate for the presence of anions of elements such as F, Cl, Br and O within the phosphor, either substituting for N within the $M'_2Si_5N_8$ crystal lattice, or filling interstitial positions within the crystal lattice. These anions may either be present in the phosphor material intentionally, or as contaminants. Contaminants, such as oxygen, may be from environmental sources. According to some embodiments, the phosphor may have halide and/or oxygen intentionally introduced in a range from 0 to about 6 mole percent. Halide may be added by using one or more starting materials comprising a halide, for example: $EuCl_3$, $EuF_3$, $EuBr_3$, $NH_4F$, etc. Oxygen may be added by using one or more starting materials comprising an oxide, for example: $Eu_2O_3$, $SiO_2$, etc. Furthermore, the methods for controllably incorporating oxygen in to the phosphor material that are described in U.S. patent application Ser. No. 13/871,961, incorporated herein by reference in its entirety, may be used for incorporation of oxygen into the phosphors of the present invention.

Next the disclosure will present phosphors based on the present modifier cation-stabilized $M_xM'_2A_{5-y}D_yE_8$:A embodiments, giving their advantages and properties, and how these phosphors differ from the prior art. Specific examples will be given, including a phosphor wherein the column IIIB element substituting for $Si^{4+}$ is $Al^{3+}$, and wherein the modifying cation is $Ca^{2+}$, and other examples in which y=0. Accelerated aging results will be discussed which show the superior thermal and chemical stability of the phosphors of the present invention over other prior art 2-5-8 based phosphors. Finally, SEM micrographs will show the change in morphology of the phosphor crystals as the amount of Ca is increased beyond the amount used to charge balance the substitution of Si by Al.

Discussion of the Present Phosphors Based on $Ca_xSr_2Si_{5-y}Al_yN_8$:A

Fifteen different phosphor samples were prepared as described in more detail below with reference to Tables 1A, 1B, 2A, 2B, 3A, 3B, 4A and 4B. PL spectra, CIE coordinates, XRD and SEM data were collected for samples, as discussed in more detail below.

Sample 1 is a well-known 2-5-8 red-emitting nitride phosphor used herein as a control; it has the composition $Sr_{1.95}Si_5N_8Eu_{0.05}$. Samples 2 through 5 are based on the composition of Sample 1, but with increasing amounts of calcium added as modifier cations; in these samples the modifier cations do not have a charge compensation role to play, for Si substitution at least. These samples have a composition represented by the formula $Ca_xSr_{1.95}Si_5N_8Eu_{0.05}$.

Samples 6 through 8 are based on the composition of Sample 1, but with calcium substituting for strontium in increasing amounts; in these samples the modifier cations do not have a charge compensation role to play. These samples have a composition represented by the formula $Ca_xSr_{1.95-x}Si_5N_8Eu_{0.05}$. These Samples are compared with Samples 2 through 4 which have the same amount of calcium added, but in Samples 2 through 4 the calcium does not substitute for strontium—it is in addition to the strontium and is expected to be present in the phosphor crystal in interstitial lattice positions.

Samples 9 through 12 are based on the composition of Sample 1, but with (1) some aluminum substituted for silicon, and (2) with increasing amounts of calcium added as modifier cations, where the calcium is BOTH playing the role of charge compensation for the substitution of aluminum for silicon, and is present in amounts beyond what is needed for charge compensation and may result in improved phosphor stability under conditions of heat and humidity. These samples have a composition represented by the formula $Ca_xSr_{1.95}Si_{4.9}Al_{0.1}N_8Eu_{0.05}$.

Samples 13 through 15 are similar to Samples 9 through 12, except for the amount of aluminum being slightly greater in Samples 13 through 15. These samples have a composition represented by the formula $Ca_xSr_{1.95}Si_{4.88}Al_{0.12}N_8Eu_{0.05}$. Furthermore, Sample 13 has only enough additional calcium to charge compensate the substitution of aluminum for silicon, whereas Samples 14 & 15 have amounts of calcium beyond what is needed for charge compensation.

According to some embodiments, the phosphors, under blue excitation, may be configured to emit light having a peak emission wavelength greater than about 620 nm, in embodiments greater than 623 nm, and in further embodiments greater than about 626 nm, where blue may be defined as light having a wavelength ranging from about 420 nm to about 470 nm. The present phosphors may also be excited by radiation having shorter wavelengths; e.g., from about 200 nm to about 420 nm, but when the excitation radiation is in the x-ray or UV, a separate blue-emitting phosphor is provided to contribute a blue component to the desired white light for a white light source. Furthermore, the present phosphors may also be excited by radiation having longer wavelengths, wherein the wavelength ranges from about 200 nm to about 550 nm. A common blue excitation source is an InGaN LED, or GaN LED, emitting with a peak at about 460 nm. According to some embodiments, a solid state excitation source is provided, having an emission wavelength within a range from 200 nm to 480 nm, and a red-emitting phosphor is configured to absorb excitation radiation from that excitation source and to emit light having a peak emission wavelength in the range from 620 nm to 650 nm. According to other embodiments, a red-emitting phosphor is configured to absorb excitation radiation from that excitation source and to emit light having a peak emission wavelength in the range of 624 nm to 632 nm.

FIGS. 5A-5D show trends based on the phosphor calcium content of the peak emission wavelength, peak photoluminescence intensity (PL) and CIE x and y chromaticity coordinates, for red-emitting nitride-based calcium-stabilized phosphors Samples 2 through 5 (no aluminum) and 9 through 12 (aluminum containing), according to some embodiments of the present invention. All of these phosphors have excess calcium, beyond what is required for charge balance in the case of the aluminum-containing samples; and all of these phosphors are assumed to have the calcium present in the crystal structure at interstitial sites. The trends for the no aluminum and the aluminum-containing samples are very similar, suggesting that the trends may be dominated by the interstitial calcium content.

FIGS. 6A-6D show trends with phosphor calcium content of the peak emission wavelength, peak photoluminescence intensity (PL) and CIE x and y chromaticity coordinates, for red-emitting nitride-based calcium-stabilized phosphors Samples 2 through 4 (additional calcium) and 6 through 8 (substitutional calcium), according to some embodiments of the present invention. There is an appreciable difference in the trends between the additional (assumed interstitial) calcium and the substitutional calcium, suggesting the location of the calcium within the crystal lattice may be significant.

Reliability Testing

Within many territories including the United States, regulatory bodies set performance criteria for replacement LED lamps. For example the US Environmental Protection Agency (EPA) in conjunction with the US Department of Energy (DOE) promulgates performance specifications under which a lamp may be designated as an "ENERGY STAR®" compliant product, e.g. identifying the power usage requirements, minimum light output requirements, luminous intensity distribution requirements, luminous efficacy requirements, life expectancy, etc. The ENERGY STAR® "Program Requirements for Integral LED Lamps" requires that for all LED lamps "the change of chromaticity over the minimum lumen maintenance test period (6000 hours) shall be within 0.007 on the CIE 1976 (u',v') diagram" and depending on lamp type, the lamp must have "70% lumen maintenance (L70) at 15,000 or 25,000 hours of operation". The ENERGY STAR® requirements are for the lamp performance and include all components of the lamp such as the LEDs, phosphor, electronic driver circuitry, optics and mechanical components. In principal, the degradation in brightness of a white LED with aging can be due not only to the phosphor, but also to the blue LED chip. Additional sources of degradation can come from the packaging materials (such as the substrate), the bond wires and other components encapsulated with silicone. In contrast, the factors affecting the change in color coordination are dominated primarily by phosphor degradation. In terms of phosphor performance it is believed that in order to comply with ENERGY STAR® requirements would require a change in chromaticity (CIE $\Delta x$, CIE $\Delta y$) of $\leq 0.01$ for each coordinate over 1000 hours for the phosphor under accelerated testing at 85° C. and 85% relative humidity. The accelerated testing is done on phosphor coated 3000K white LEDs prepared as follows: phosphor particles are combined with a binder, such as epoxy or silicone, and then applied to the LED chip. The coated LED is placed in an oven at the specified temperature and humidity and operated continuously for the testing period.

FIGS. 7A-7C, 8A-8C, 9A-9C and 10A-10C show the results of reliability testing under the conditions of 85° C. and 85% relative humidity of phosphor Samples 2 through 4, Samples 1, 3 and 7, Samples 1, 3 and 10 and Samples 13 through 15, respectively. The figures show the change in photoluminescent intensity (brightness) with time, the change in CIE x chromaticity coordinate with time, and the change in CIE y chromaticity coordinate with time. The $Sr_2Si_5N_8$:Eu control sample (Sample 1) showed results that would typically be unacceptable to the industry—all other Samples showed different levels of improvement over the control, the best performance being shown by Samples 10 & 15 which will most likely satisfy the typical industry heat and humidity stability requirement.

Figure 7A:
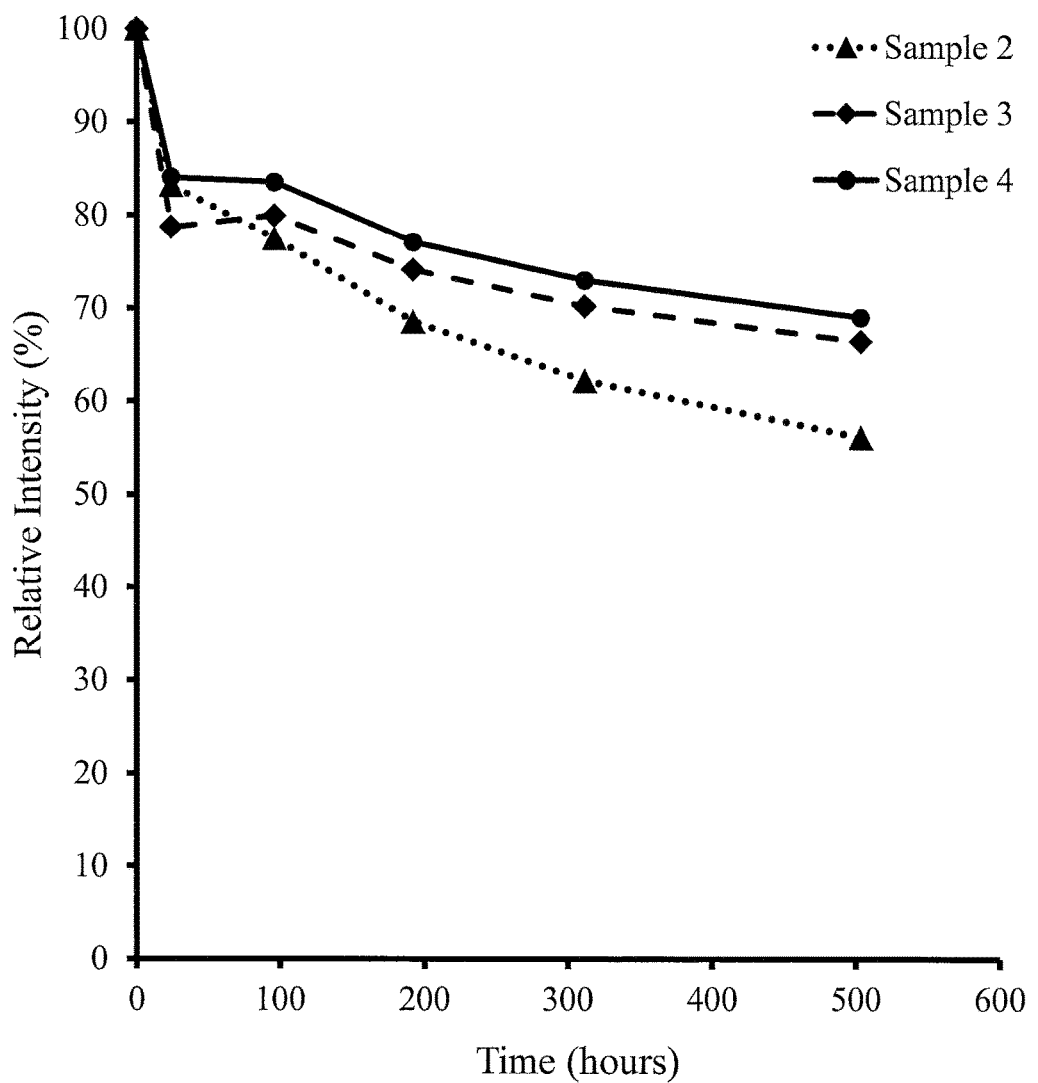
FIGS. 7A-7C show the results of reliability testing under the conditions of 85° C. and 85% relative humidity of the red-emitting nitride-based calcium-stabilized phosphors Samples 2 through 4, where
Figure 7B:
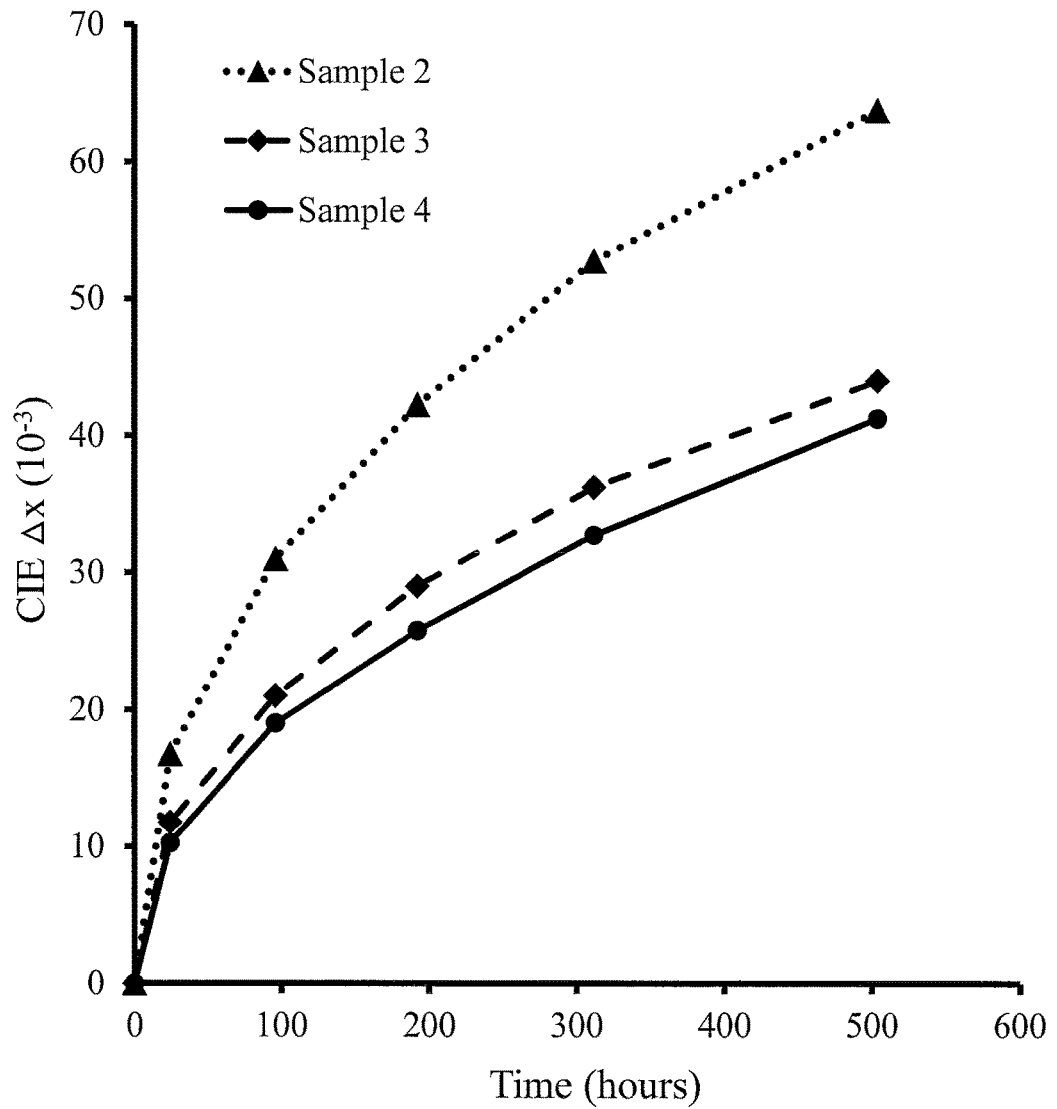
Figure 7C:
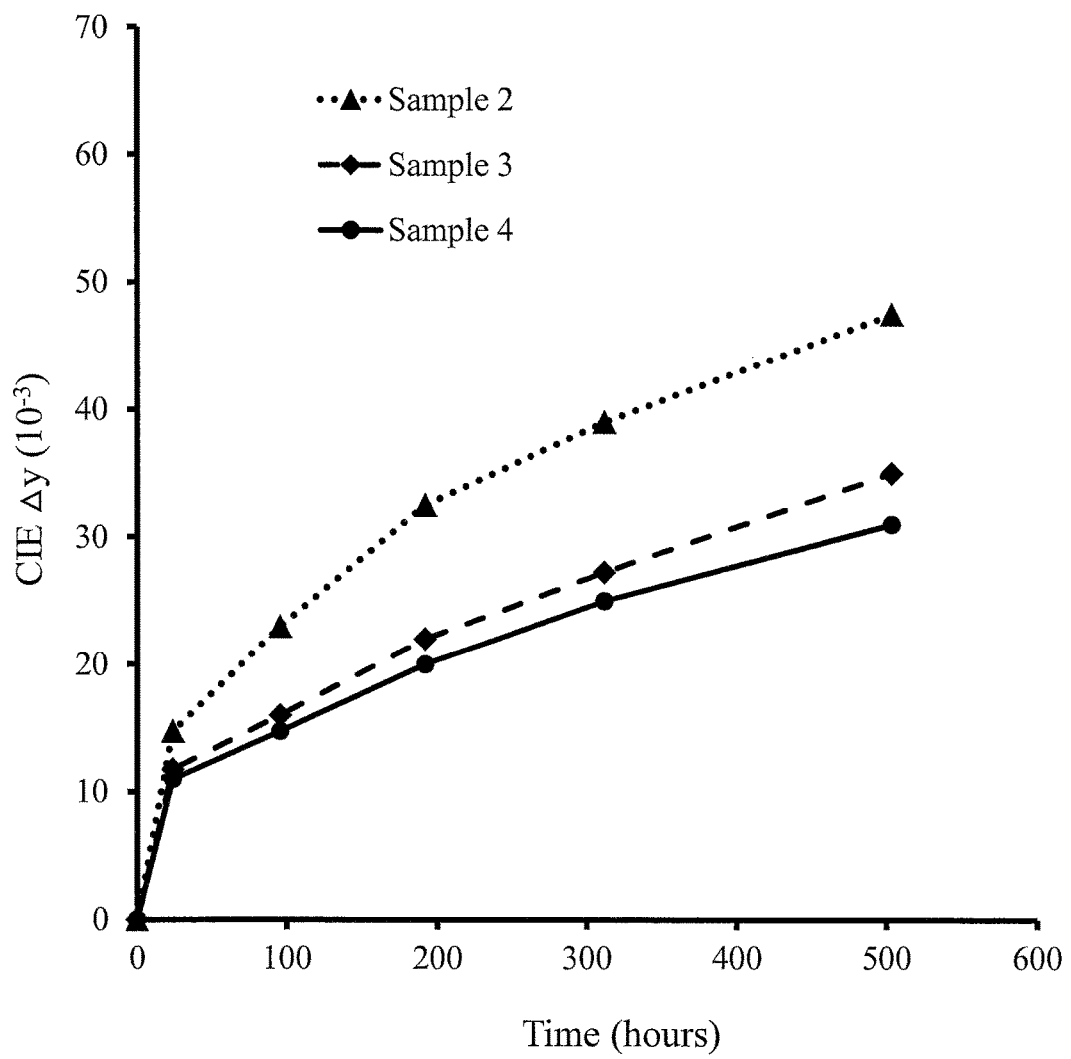
Figure 8A:
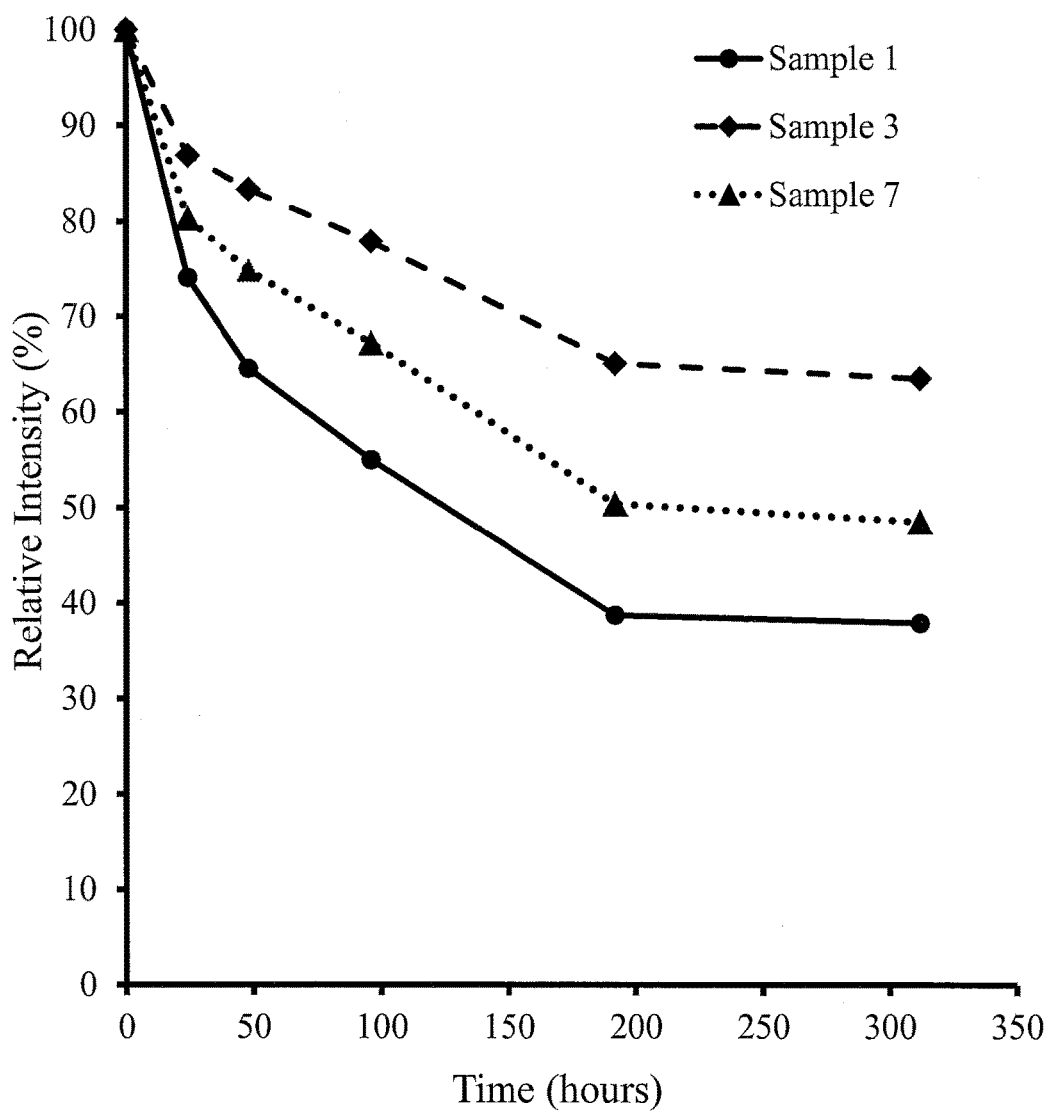
FIGS. 8A-8C show the results of reliability testing under the conditions of 85° C. and 85% relative humidity of the red-emitting nitride-based calcium-stabilized phosphors Samples 3 (additional calcium) and 7 (substitutional calcium), where
Figure 8B:
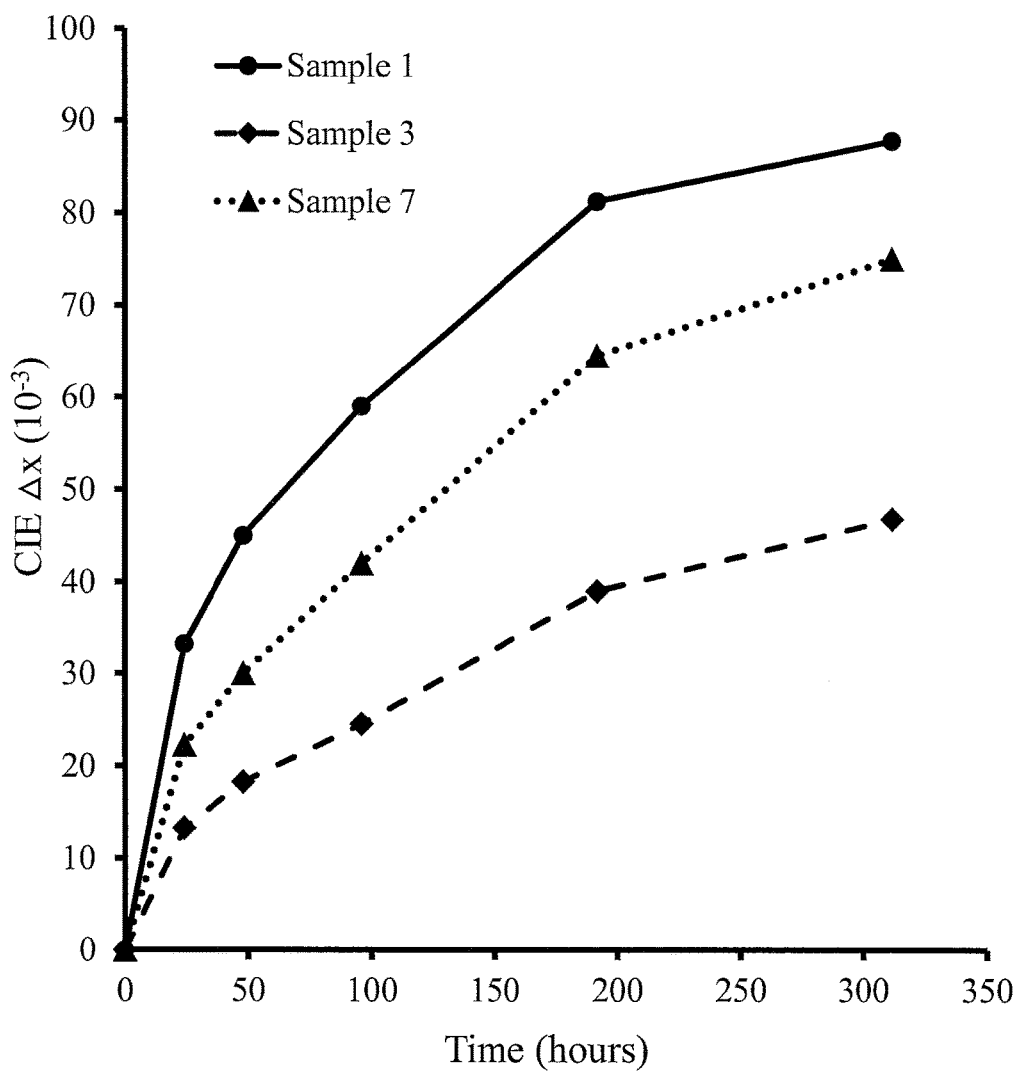
Figure 8C:
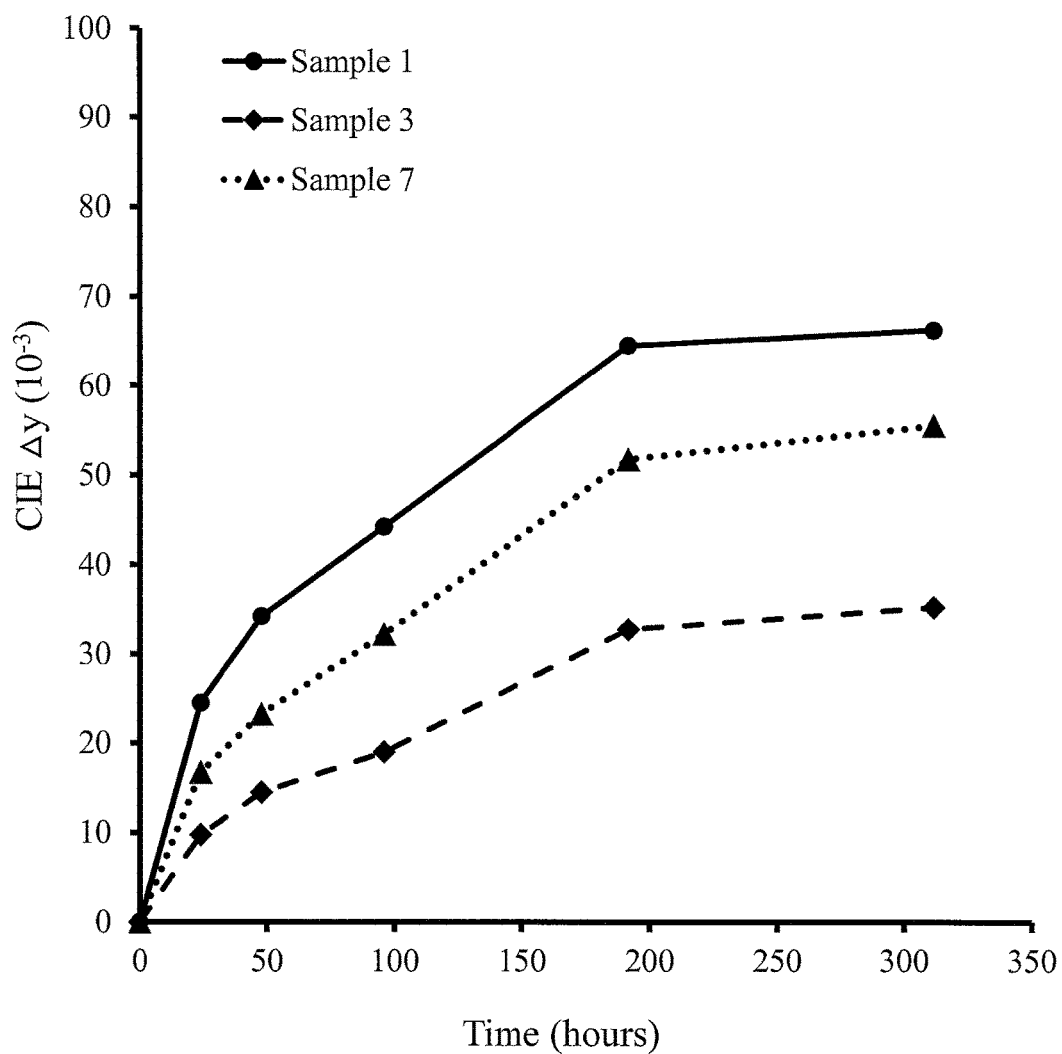
Figure 9A:
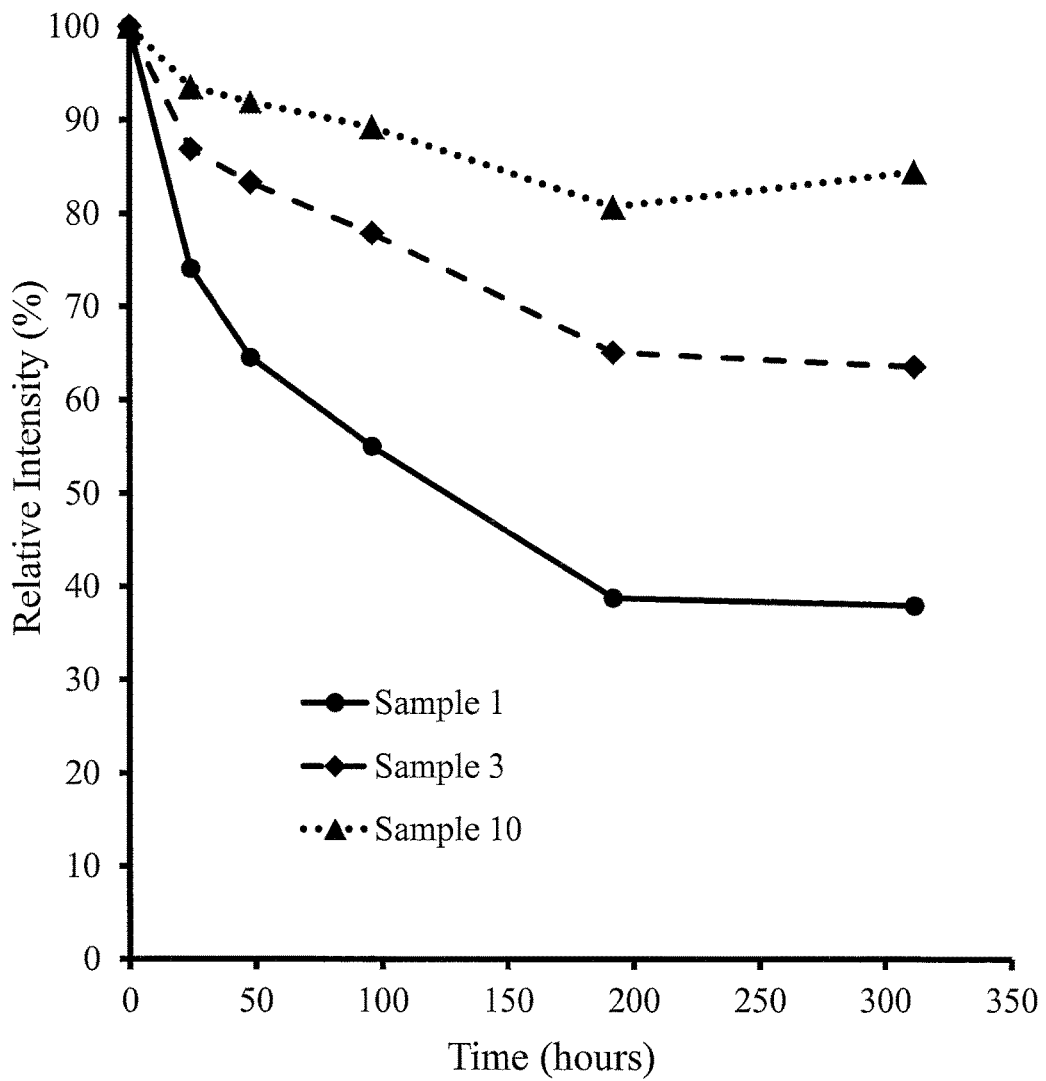
FIGS. 9A-9C show the results of reliability testing under the conditions of 85° C. and 85% relative humidity of the red-emitting nitride-based calcium-stabilized phosphors Samples 3 (no aluminum) and 10 (aluminum containing), where
Figure 9B:
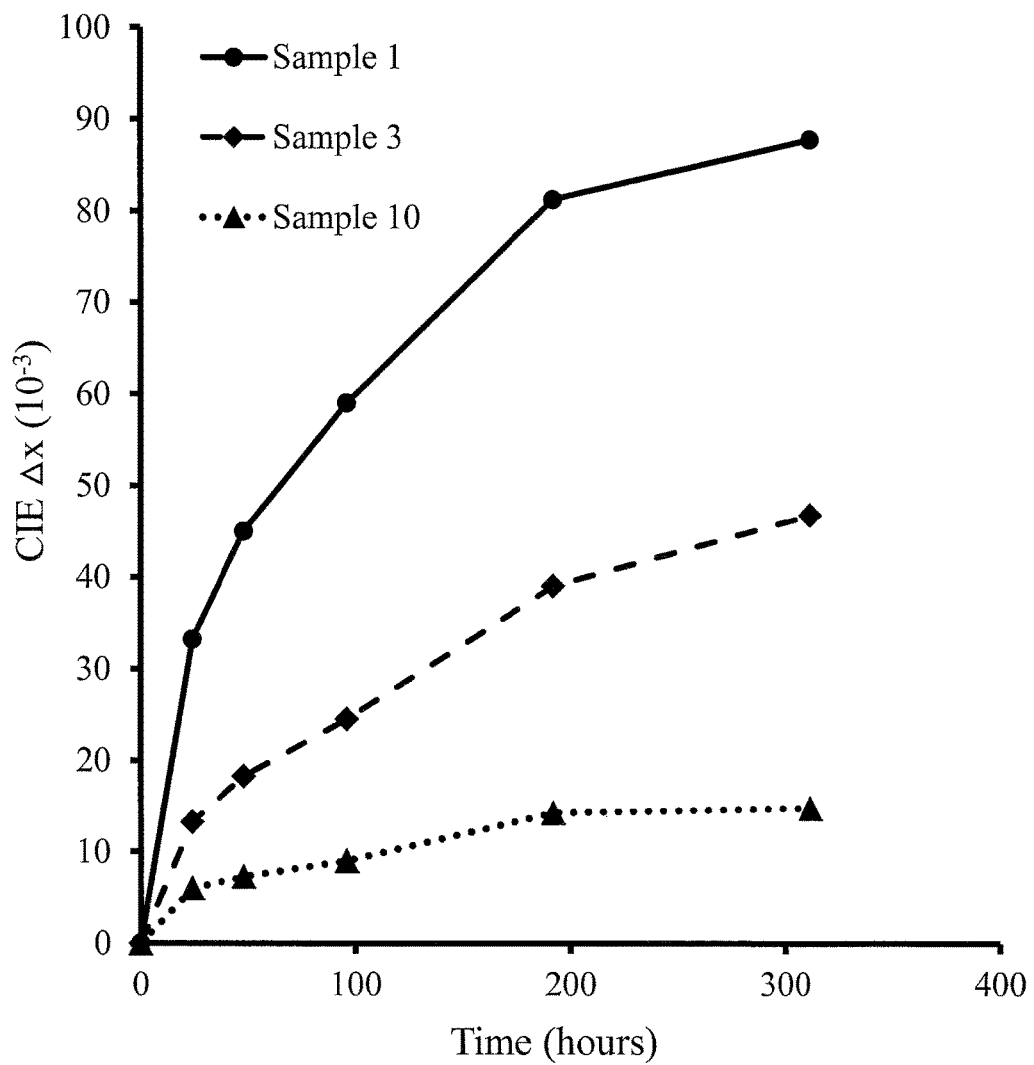
Figure 9C:
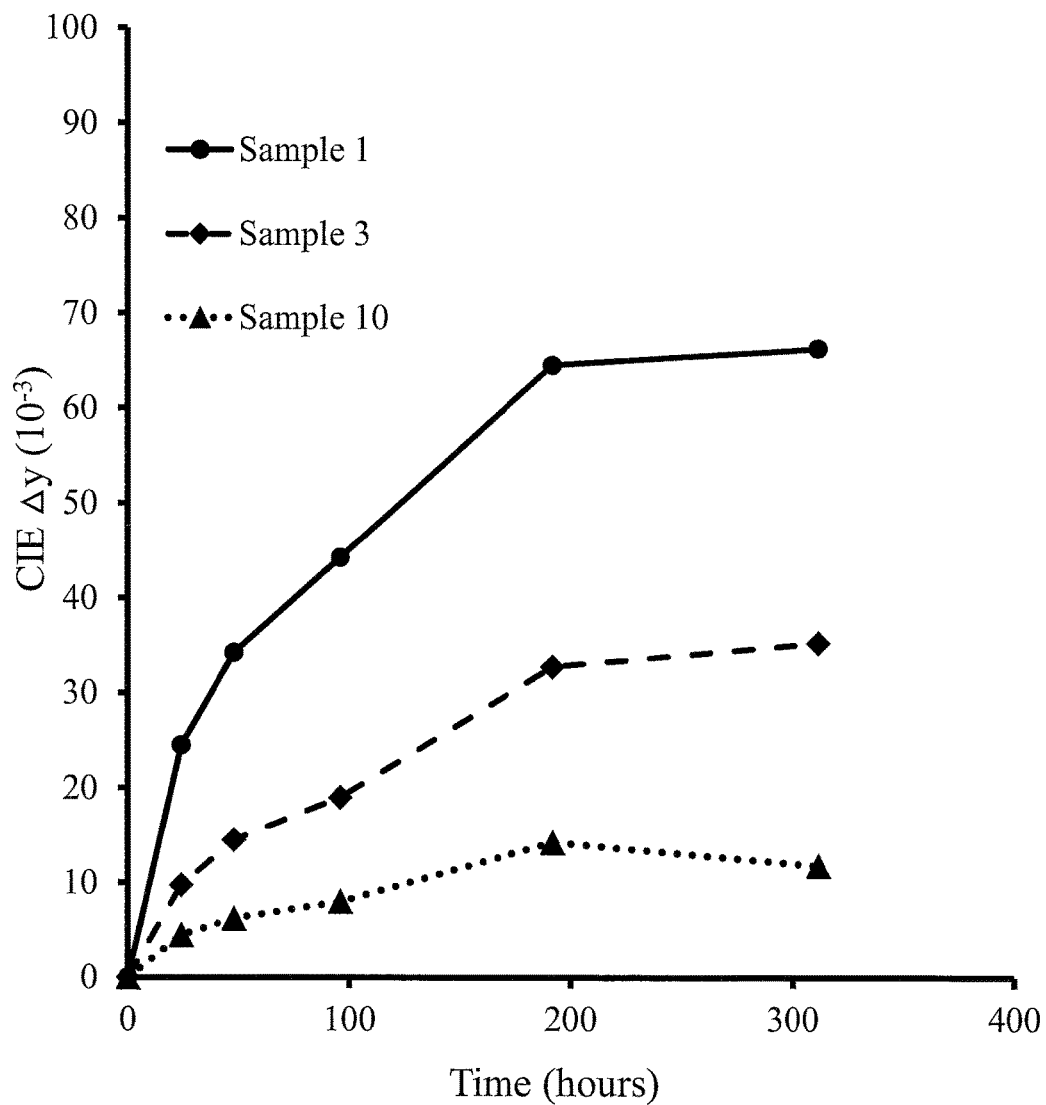
Figure 10A:
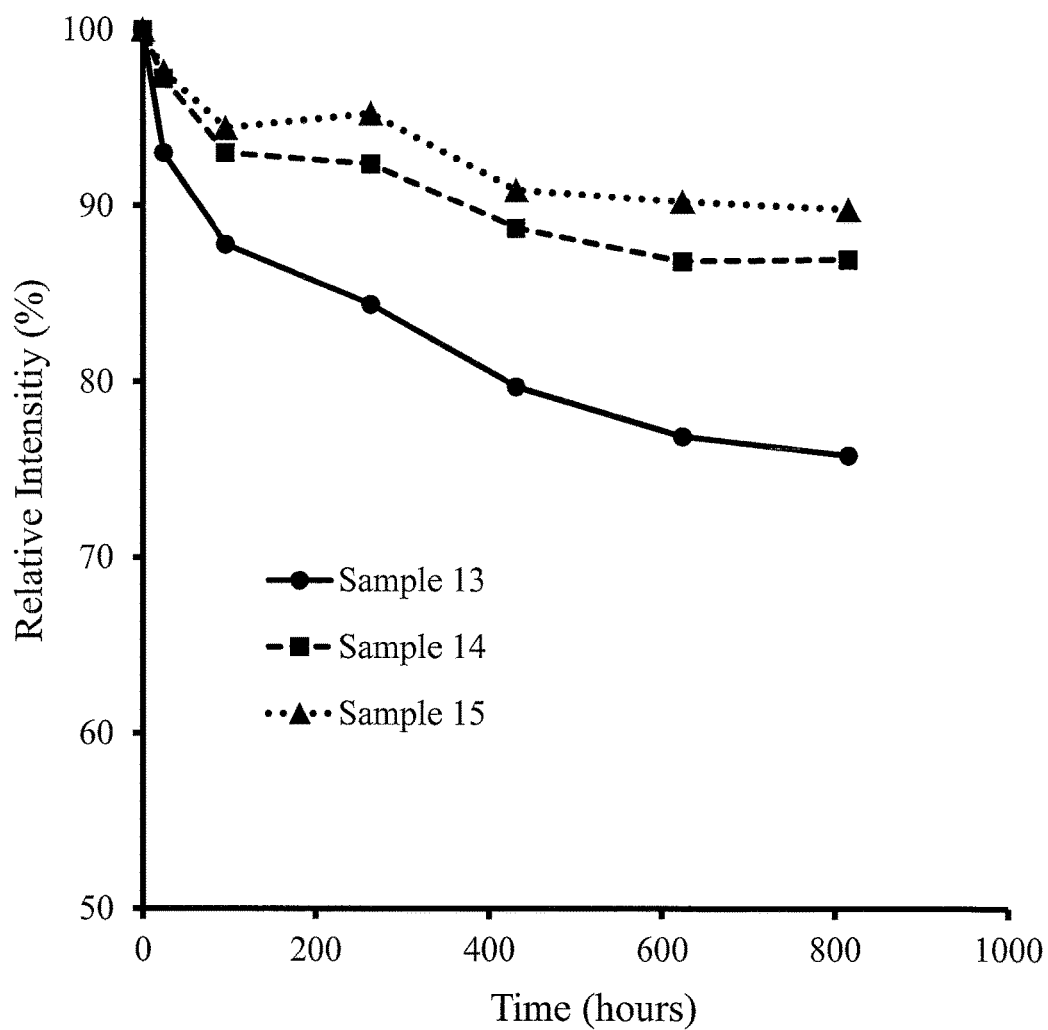
FIGS. 10A-10C show the results of reliability testing under the conditions of 85° C. and 85% relative humidity of the red-emitting nitride-based calcium-stabilized phosphors Samples 13 through 15, where
Figure 10B:
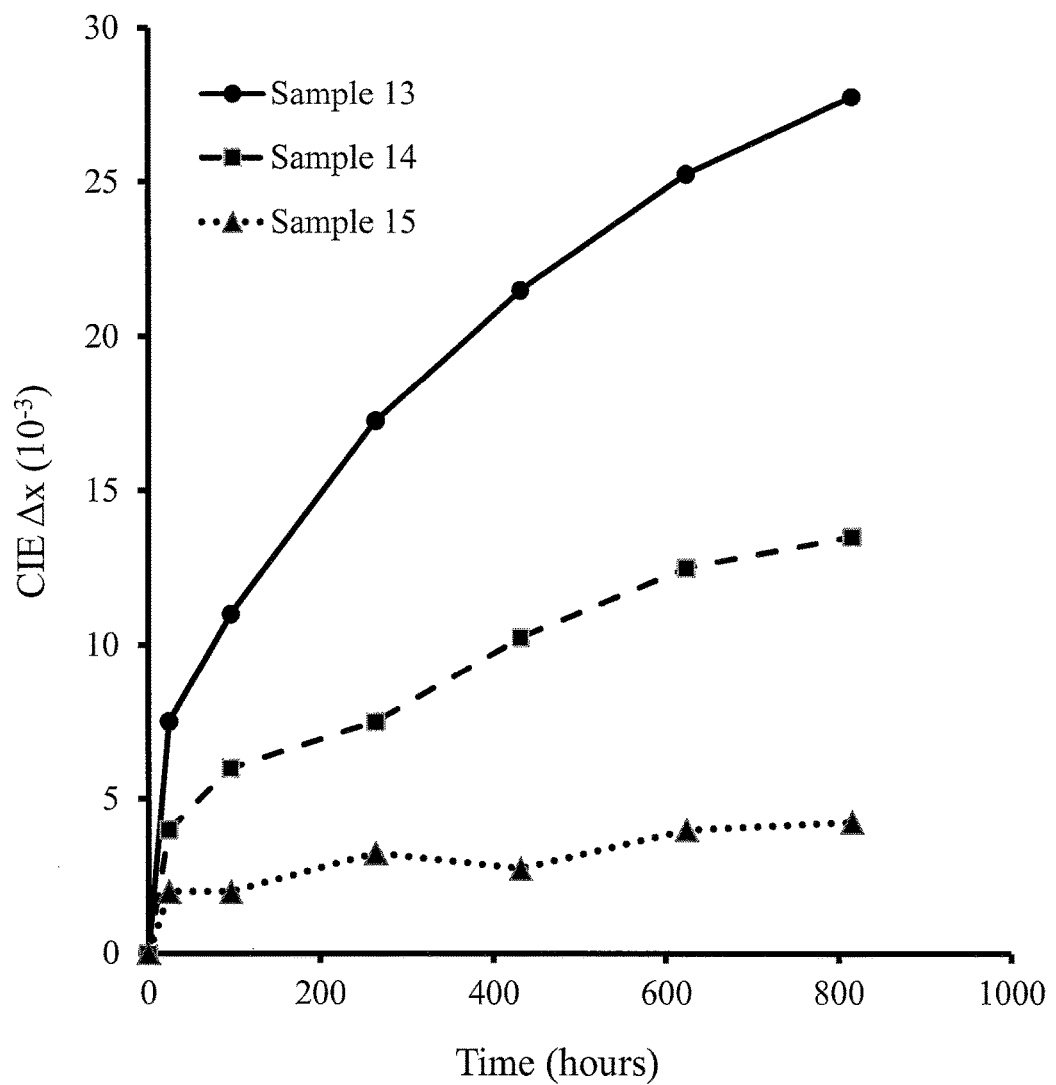
Figure 10C:
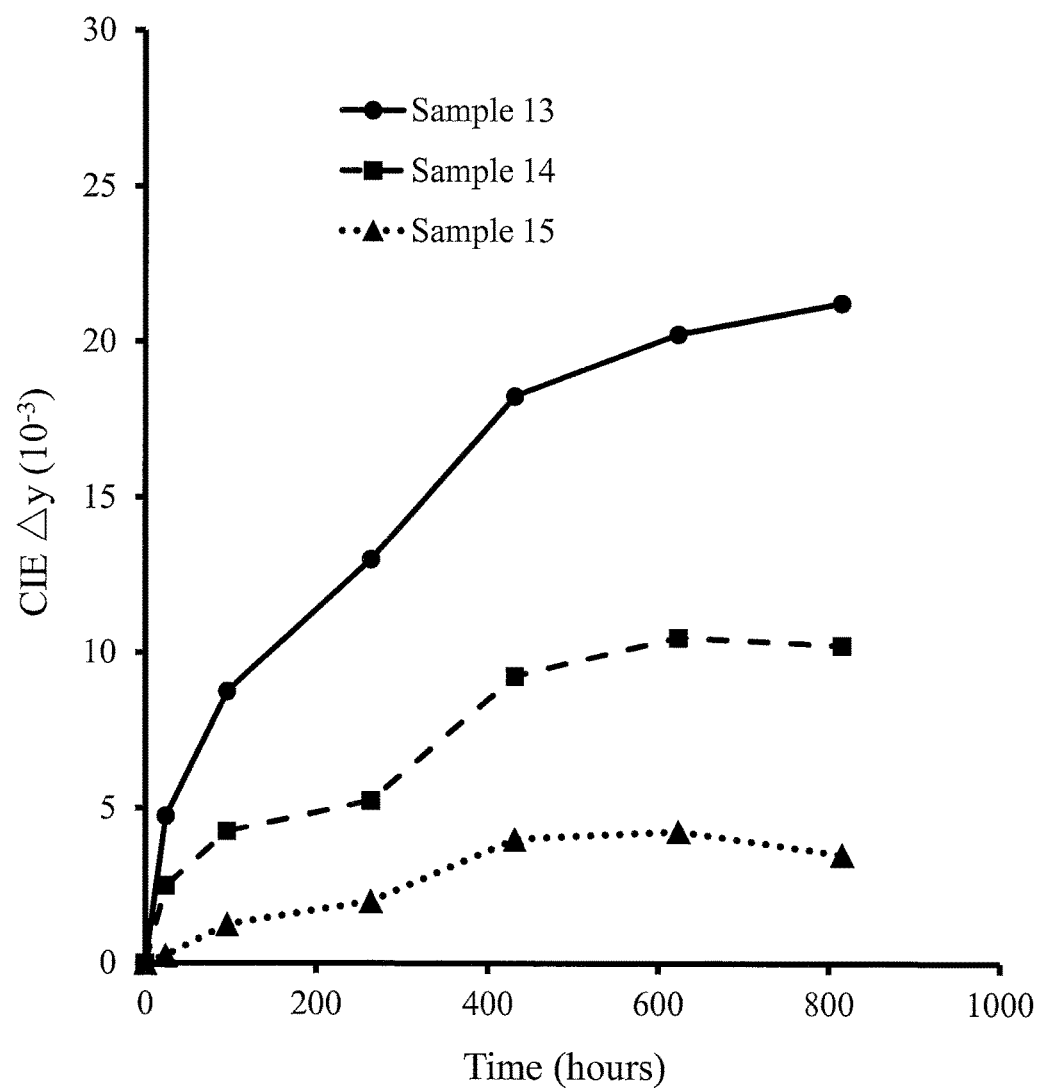

In more detail, FIGS. 7A-7C show an improvement in reliability with increase in additional calcium content of the no aluminum-content phosphors. FIGS. 8A-8C compare the control with a substitutional calcium phosphor and an additional calcium phosphor—all phosphors without aluminum and where the two calcium-containing phosphors differ in composition only in that Sample 3 has more strontium than Sample 7, since in Sample 7 the calcium has substituted for strontium; the best reliability is seen for the phosphor with additional calcium. FIGS. 9A-9C compare the control with an additional calcium phosphor without aluminum and an additional calcium phosphor with aluminum—the two calcium-containing phosphors differ in composition only in that Sample 10 contains aluminum and Sample 3 does not; the best reliability is seen for the phosphor containing aluminum. FIGS. 10A-10C show an improvement in reliability for the additional calcium phosphors with increase in calcium content. In summary, the most significant improvement in stability over the control (Sample 1), as defined by maintaining intensity and chromaticity, is realized by Ca interstitial charge balancing and Al substituting for Si, plus excess interstitial Ca (beyond what is required for charge balance of the Al); the best stability results are seen for the higher Ca/Al ratio materials, as exemplified by Samples 10 & 15 (see Tables 3B & 4B). It should be noted that Samples 10 & 15 are uncoated phosphors, and yet shows excellent stability—stability data is shown for up to 800 hours for Sample 15 and it is expected that after 1000 hours Sample 15 will meet the accelerated testing criteria used to establish ENERGY STAR® compliance. Even though Samples 10 & 15 show excellent stability without coating, Samples 10 & 15 can be coated to provide expected further stability improvement. Similarly, other Samples can be coated to improve stability.

To provide a potential further improvement in performance the particles of the phosphor with the composition of the Samples of the present invention can be coated with one or more coatings of, for example, SiO2, AhO3 and/or TiO2, as taught in commonly-owned U.S. Pat. No. 9,006,966 for COATINGS FOR PHOTOLUMINESCENT MATERIALS and U.S. Pat. App. Pub. No. 2013/0092964 for HIGHLY RELIABLE PHOTOLUMINESCENT MATERIALS HAVING A THICK AND UNIFORM TITANIUM DIOXIDE COATING, the content of each of which is incorporated in its entirety herein by way of reference thereto.

XRD of the Present Phosphor Compositions

FIGS. 11-14 show XRD patterns of red-emitting nitride-based phosphors of the present invention; the XRD pattern for sample 1 is shown for comparison.

Morphology of Phosphor Particles of the Present Phosphor Compositions

Figure 15:
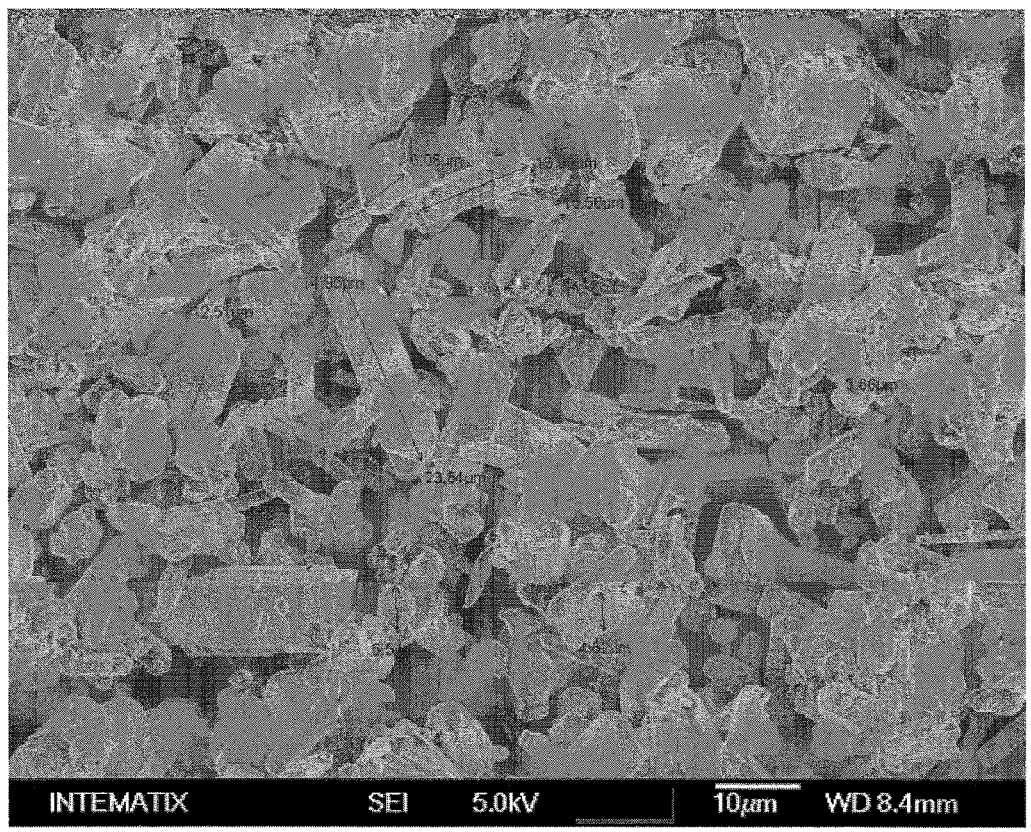
FIGS. 15-17 show SEM micrographs of red-emitting nitride-based calcium-stabilized phosphors Sample 3 (FIG. 16) (additional calcium) and Sample 7 (FIG. 17) (substitutional calcium), according to some embodiments of the present invention, and prior art red-emitting nitride-based 2-5-8 phosphor Sample 1 (FIG. 15) is shown for comparison.
Figure 16:
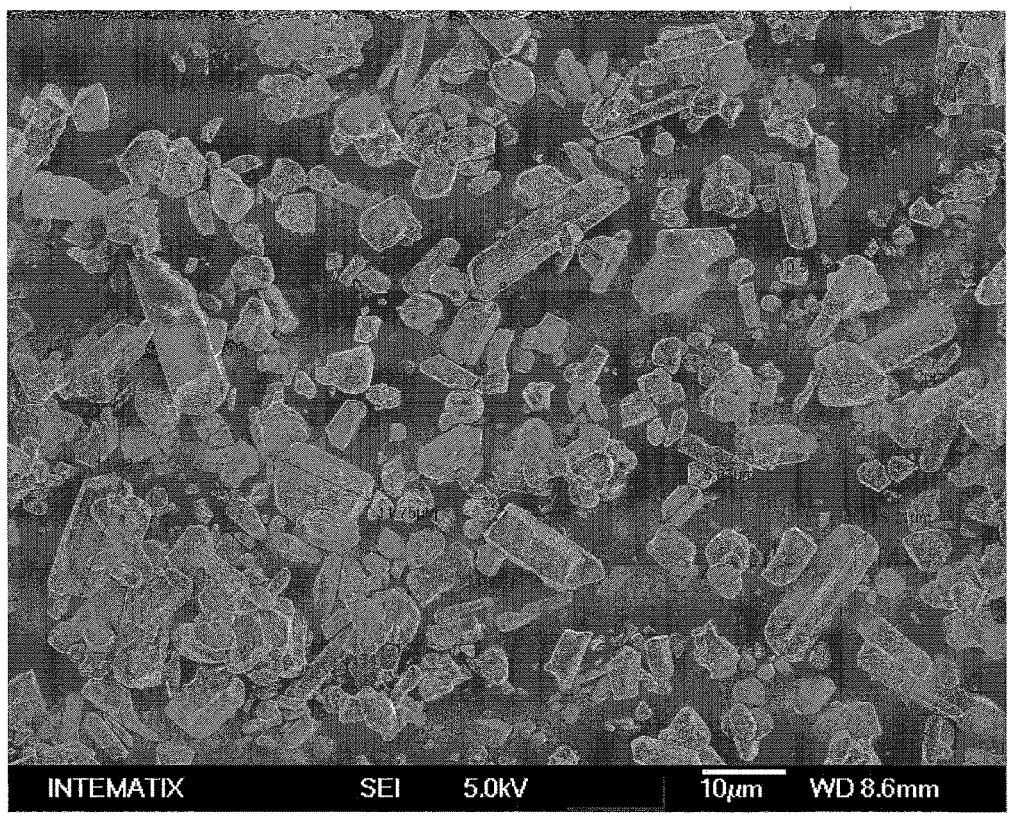
Figure 17:
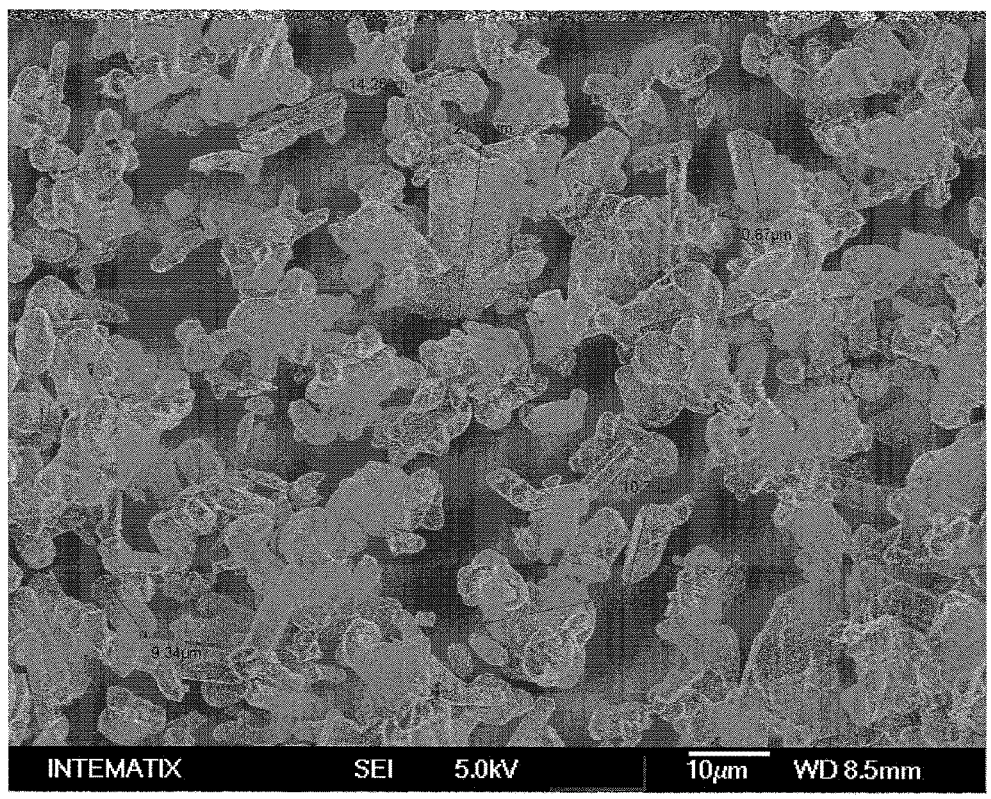

FIGS. 15-17 show secondary electron micrographs of as prepared red-emitting nitride-based calcium-stabilized phosphors Sample 3 (FIG. 16) (additional calcium) and Sample 7 (FIG. 17) (substitutional calcium), according to some embodiments of the present invention, and prior art red-emitting nitride-based 2-5-8 phosphor Sample 1 (FIG. 15) is shown for comparison. All of FIGS. 15-17 show some particles with a higher aspect ratio (length to width)—in excess of 3. Furthermore, a comparison of FIGS. 15-17 suggests that the percentage of high aspect ratio particles is greater for the control (FIG. 15) than for the samples of the phosphors of the present invention.

Synthesis of the Present Phosphors

For each of the examples and comparative examples described herein, the starting materials included at least one of the compounds $Si_3N_4$, AlN, $Ca_3N_2$, $Sr_3N_2$, BN, GaN, $SiO_2$, $Al_2O_3$, and $EuCl_3$.

Samples 1 Through 5

To obtain desired compositions of the phosphors exemplified in Samples 1 through 5, solid powders were weighed according to the compositions listed in Table 1A. This mixture of raw materials were then loaded into a plastic milling bottle together with milling beads, sealed in a glove box, followed by a ball milling process for about 2 hours. The mixed powders were then loaded into a molybdenum crucible having an inner diameter of 30 mm and a height of 30 mm; the loaded crucible was covered with a molybdenum lid and placed into a gas sintering furnace equipped with a graphite heater.

After loading the crucible, the furnace was evacuated to $10^{-2}$ Pa, and the sample heated to 150° C. under these vacuum conditions. At the 150° C. temperature, a high purity $N_2$ gas was introduced into the chamber; the temperature of the furnace was then increased to about 1700° C. at a substantially constant heating rate of 4° C./min. The samples were maintained at 1700° C. for about 7 hours.

After firing, the power was shut off and the samples allowed to cool in the furnace. The as-sintered phosphor was ground slightly, ball milled to a certain particle size, followed by a wash, dry and sieve procedure. The final product was tested using an Ocean Optics USB4000 spectrometer for photoluminescence intensity (PL) and chromaticity (CIE coordinates x and y). The x-ray diffraction (XRD) patterns of the phosphors were measured using the $K_\alpha$ line of a Cu target. The test results are listed in Table 1B.

A flux, such as ammonium chloride, may also be used in the fabrication of the phosphors of the present invention.

Figure 11:
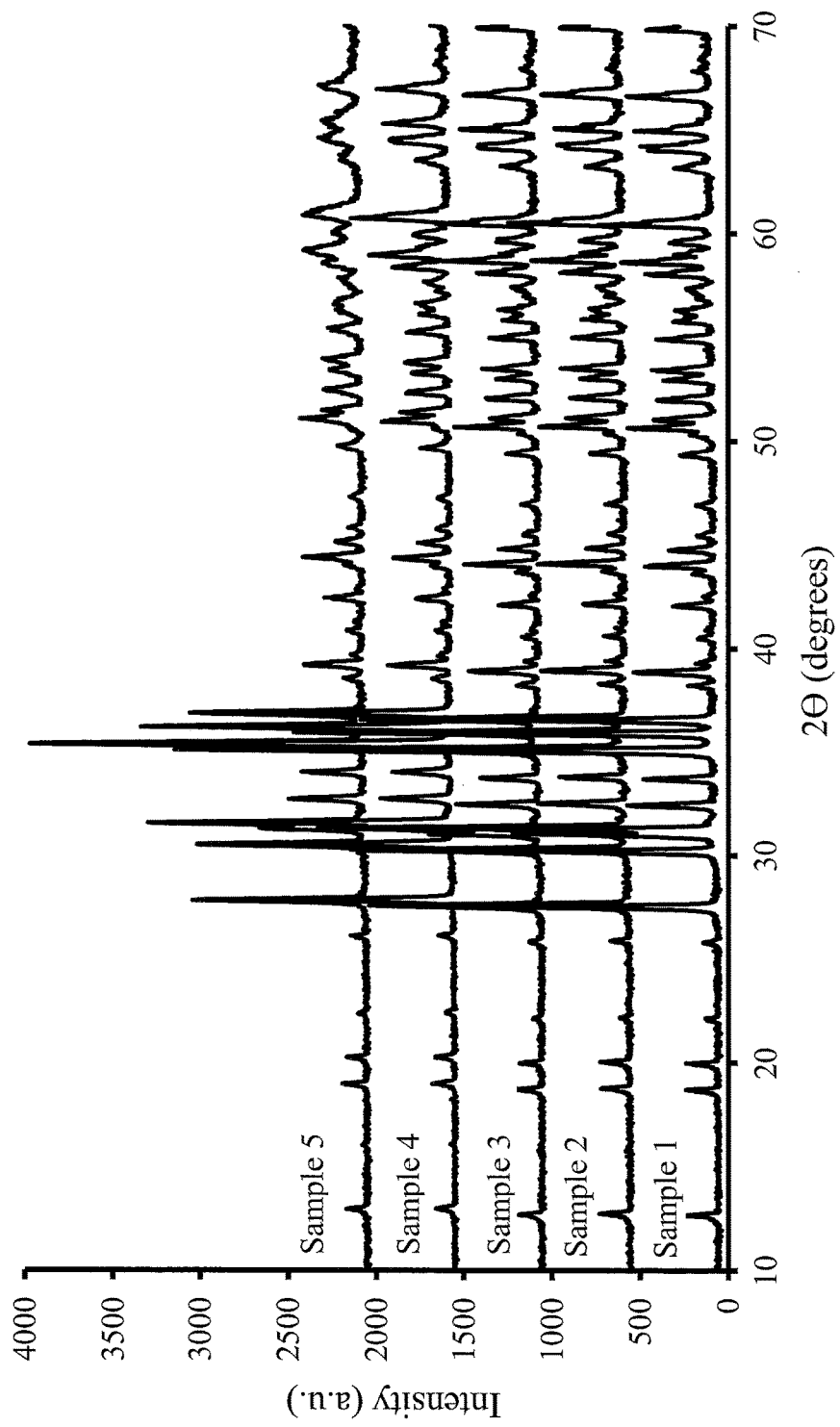
FIG. 11 shows x-ray diffraction (XRD) patterns of the red-emitting nitride-based calcium-stabilized phosphor Samples 2 through 5, according to some embodiments of the present invention, the XRD pattern for Sample 1 is shown for comparison.

FIG. 1 is the emission spectra of the phosphors from Samples 1 through 5. Powder x-ray diffraction measurements using the $K_\alpha$ line of a Cu target are shown in FIG. 11 for the phosphors of Samples 1 through 5.

TABLE 1A

Composition of starting raw materials for Samples 1 through 5

| Compound | $EuCl_3$ | $Sr_3N_2$ | $Ca_3N_2$ | $Si_3N_4$ | AlN |
|---|---|---|---|---|---|
| Sample 1 | 5.166 | 75.62 | 0 | 93.52 | 0 |
| Sample 2 | 2.583 | 37.81 | 0.988 | 46.76 | 0 |
| Sample 3 | 2.583 | 37.81 | 1.976 | 46.76 | 0 |
| Sample 4 | 2.583 | 37.81 | 2.964 | 46.76 | 0 |
| Sample 5 | 2.583 | 37.81 | 3.952 | 46.76 | 0 |

TABLE 1B

Emission Peak wavelength, Intensity and CIE of Samples 1 through 5 with Composition $Ca_xSr_{1.95}Si_5N_8Eu_{0.05}$

| | | | Test Results | | | |
|---|---|---|---|---|---|---|
| Sample | Ca Content, x | Al Content | Emission Peak Wavelength (nm) | PL Intensity (a.u.) | CIE (x) | CIE (y) |
| 1 | 0 | 0 | 622.77 | 1.56 | 0.6423 | 0.3573 |
| 2 | 0.1 | 0 | 624.10 | 1.62 | 0.6449 | 0.3547 |
| 3 | 0.2 | 0 | 626.29 | 1.61 | 0.6584 | 0.3511 |
| 4 | 0.3 | 0 | 628.64 | 1.60 | 0.6493 | 0.3502 |
| 5 | 0.4 | 0 | 630.16 | 1.56 | 0.6517 | 0.3477 |

Samples 6 Through 8

To obtain the desired compositions of the phosphors of Samples 6 through 8, solid powders were weighed according to the compositions listed in Table 2A. The same synthesis procedure as that used for Samples 1 through 5 was used. The test results are listed in Table 2B.

Figure 2:
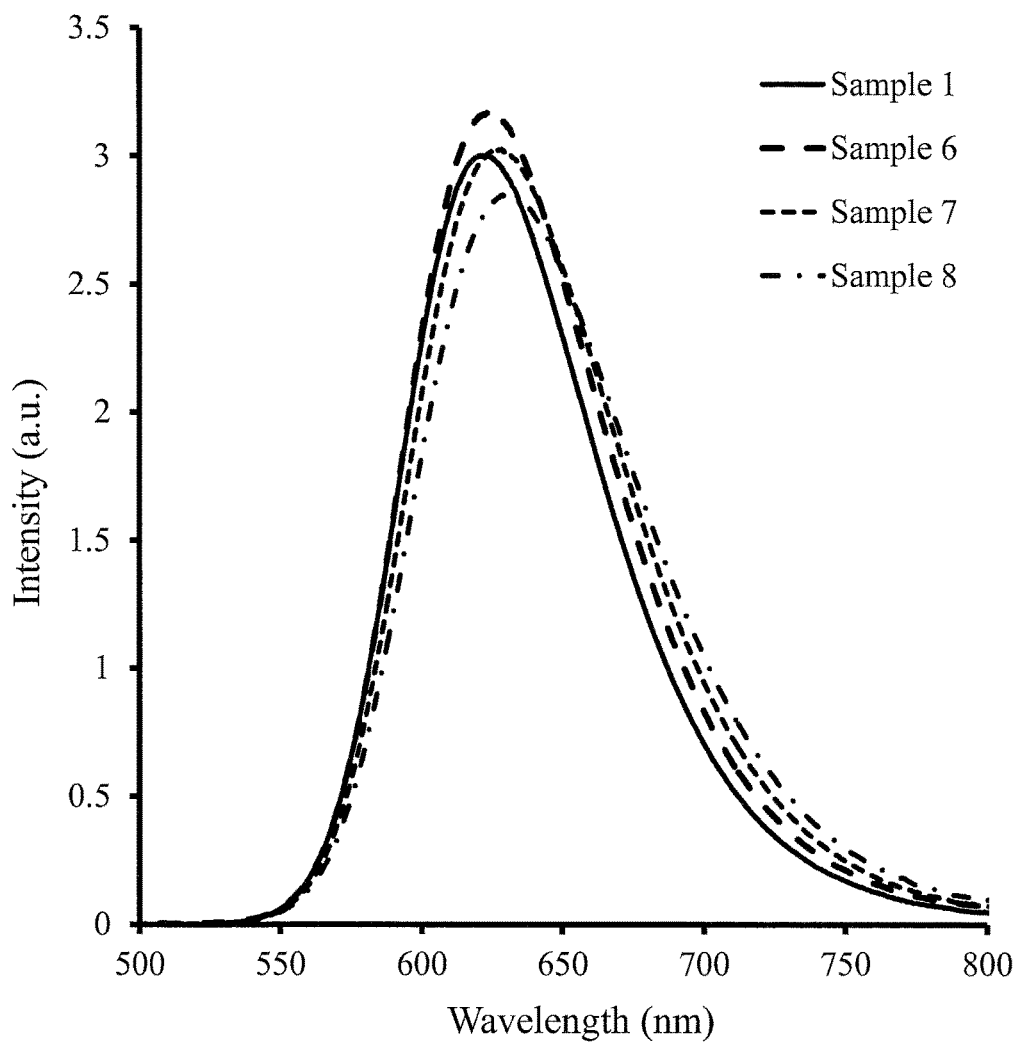
FIG. 2 shows emission spectra of the red-emitting nitride-based calcium-stabilized phosphors Samples 6 through 8, according to some embodiments of the present invention, and Sample 1 is shown for comparison.
Figure 12:
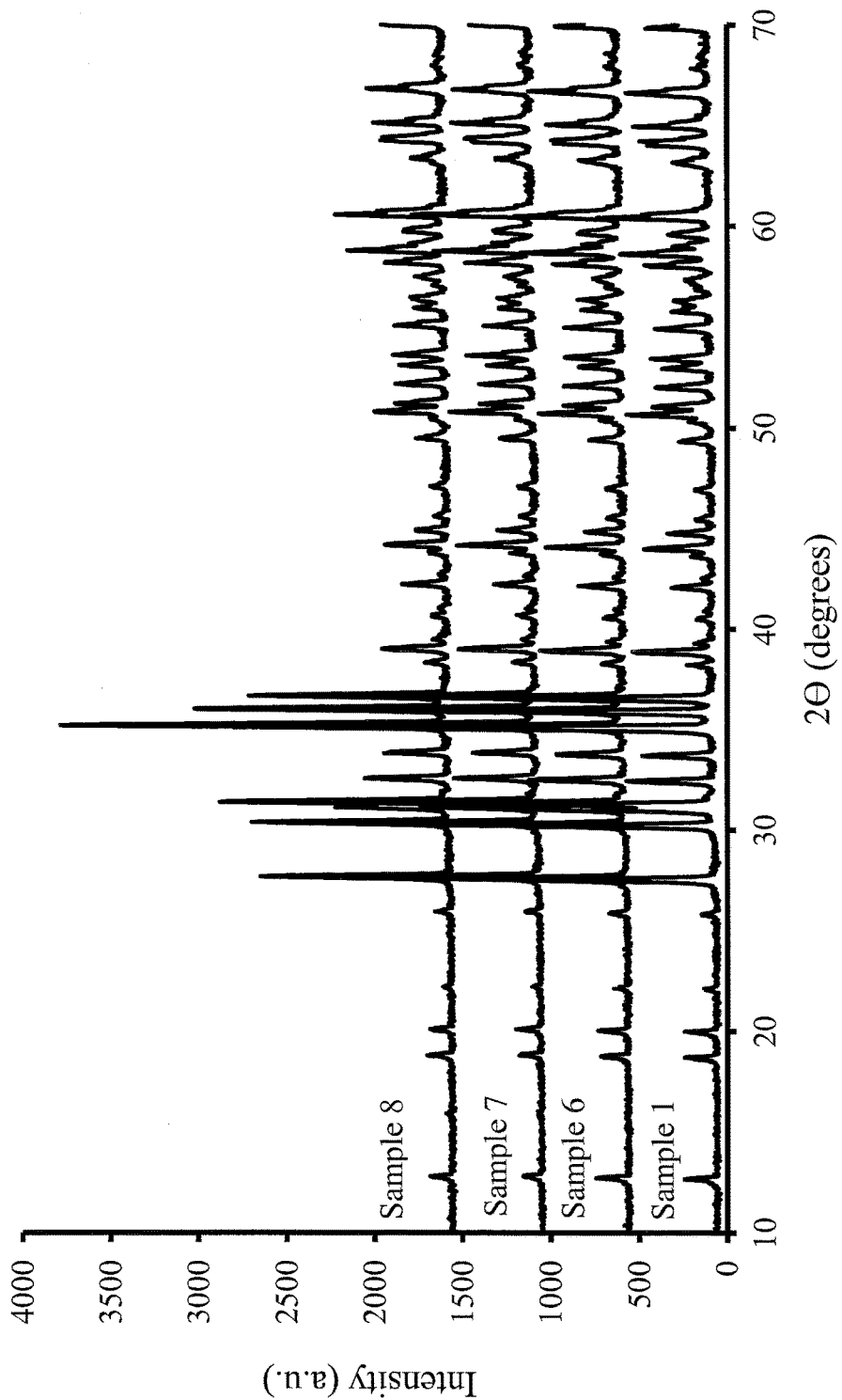
FIG. 12 shows x-ray diffraction patterns of the red-emitting nitride-based calcium-stabilized phosphor Samples 6 through 8, according to some embodiments of the present invention, the XRD pattern for Sample 1 is shown for comparison.

The emission spectra of phosphor Samples 6 through 8 are shown in FIG. 2. X-ray diffraction measurements using the $K_\alpha$ line of a Cu target were obtained, and the XRD patterns of Samples 6 through 8 are shown in FIG. 12.

TABLE 2A

Composition of starting raw materials for Samples 6 through 8

| Compound | $EuCl_3$ | $Sr_3N_2$ | $Ca_3N_2$ | $Si_3N_4$ | AlN |
|---|---|---|---|---|---|
| Sample 6 | 2.583 | 35.87 | 0.988 | 46.76 | 0 |
| Sample 7 | 2.583 | 33.93 | 1.976 | 46.76 | 0 |
| Sample 8 | 2.583 | 31.99 | 2.964 | 46.76 | 0 |

TABLE 2B

Emission Peak wavelength, Intensity and CIE of Samples 6 through 8 with Composition $Ca_xSr_{1.95-x}Si_{5-y}Al_yN_8Eu_{0.05}$

| | | | Test Results | | | |
|---|---|---|---|---|---|---|
| Sample | Ca Content, x | Al Content, y | Emission Peak Wavelength (nm) | PL Intensity (a.u.) | CIE (x) | CIE (y) |
| 6 | 0.1 | 0 | 624.54 | 1.66 | 0.6443 | 0.355 |
| 7 | 0.2 | 0 | 627.86 | 1.57 | 0.6476 | 0.352 |
| 8 | 0.3 | 0 | 631.08 | 1.51 | 0.6500 | 0.350 |

Samples 9 Through 12

To obtain the desired compositions of the phosphors of Samples 9 through 12, solid powders were weighed according to the compositions listed in Table 3A. The same synthesis procedure as that used for Samples 1 through 5 was used. The test results are listed in Table 3B.

Figure 3:
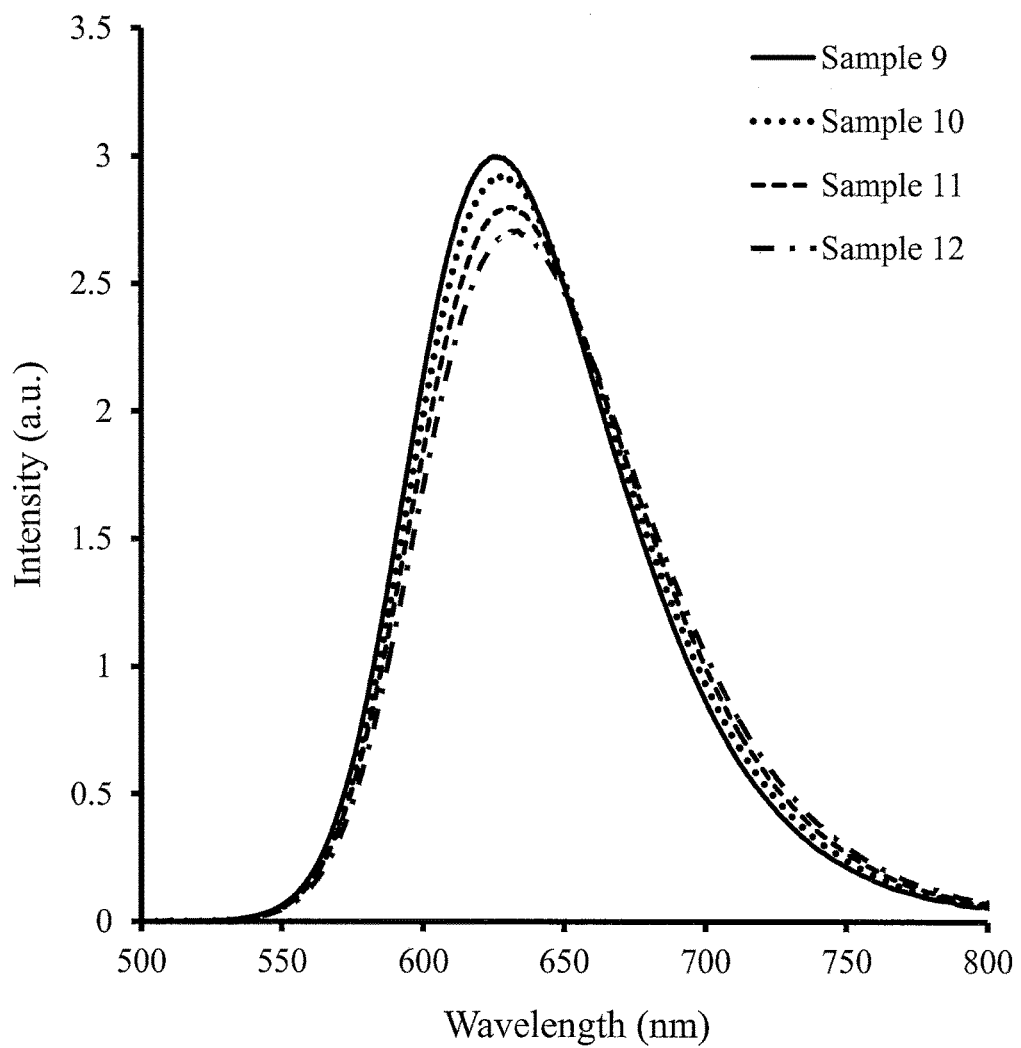
FIG. 3 shows emission spectra of the red-emitting nitride-based calcium-stabilized phosphors Samples 9 through 12, according to some embodiments of the present invention.
Figure 13:
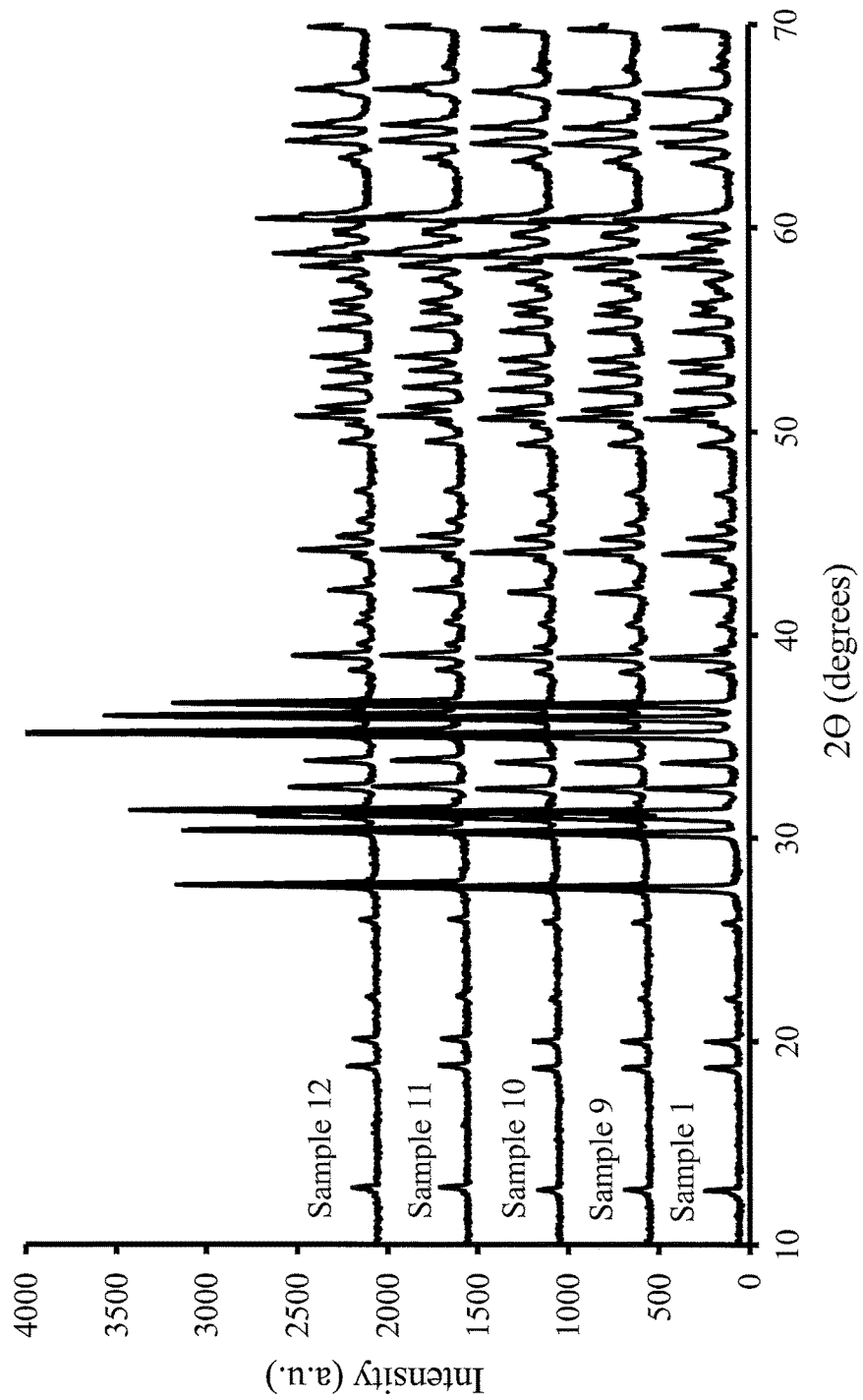
FIG. 13 shows x-ray diffraction patterns of the red-emitting nitride-based calcium-stabilized phosphors Samples 9 through 12, according to some embodiments of the present invention, the XRD pattern for Sample 1 is shown for comparison.

FIG. 3 is the emission spectra of the phosphors from Samples 9 through 12. X-ray diffraction measurements using the $K_\alpha$ line of a Cu target were obtained, and the XRD patterns of Samples 9-12 are shown in FIG. 13.

TABLE 3A

Composition of starting raw materials for Samples 9 through 12

| Compound | $EuCl_3$ | $Sr_3N_2$ | $Ca_3N_2$ | $Si_3N_4$ | AlN |
|---|---|---|---|---|---|
| Sample 9 | 2.583 | 37.81 | 0.988 | 45.83 | 0.82 |
| Sample 10 | 2.583 | 37.81 | 1.976 | 45.83 | 0.82 |
| Sample 11 | 2.583 | 37.81 | 2.964 | 45.83 | 0.82 |
| Sample 12 | 2.583 | 37.81 | 3.952 | 45.83 | 0.82 |

TABLE 3B

Emission Peak wavelength, Intensity and CIE of Samples 9 through 12 with Composition $Ca_xSr_{1.95}Si_{4.9}Al_{0.1}N_8Eu_{0.05}$

| | | | Test Results | | | |
|---|---|---|---|---|---|---|
| Sample | Ca Content, x | Al Content | Emission Peak Wavelength (nm) | PL Intensity (a.u.) | CIE (x) | CIE (y) |
| 9 | 0.1 | 0.1 | 626.50 | 1.56 | 0.6442 | 0.3554 |
| 10 | 0.2 | 0.1 | 628.42 | 1.52 | 0.6470 | 0.3526 |
| 11 | 0.3 | 0.1 | 630.75 | 1.46 | 0.6476 | 0.3520 |
| 12 | 0.4 | 0.1 | 632.71 | 1.41 | 0.6504 | 0.3492 |

Samples 13 Through 15

To obtain the desired compositions of the phosphors of Samples 13 through 15, solid powders were weighed according to the compositions listed in Table 4A. The same synthesis procedure as that used for Samples 1 through 5 was used. The test results are listed in Table 4B.

Figure 4:
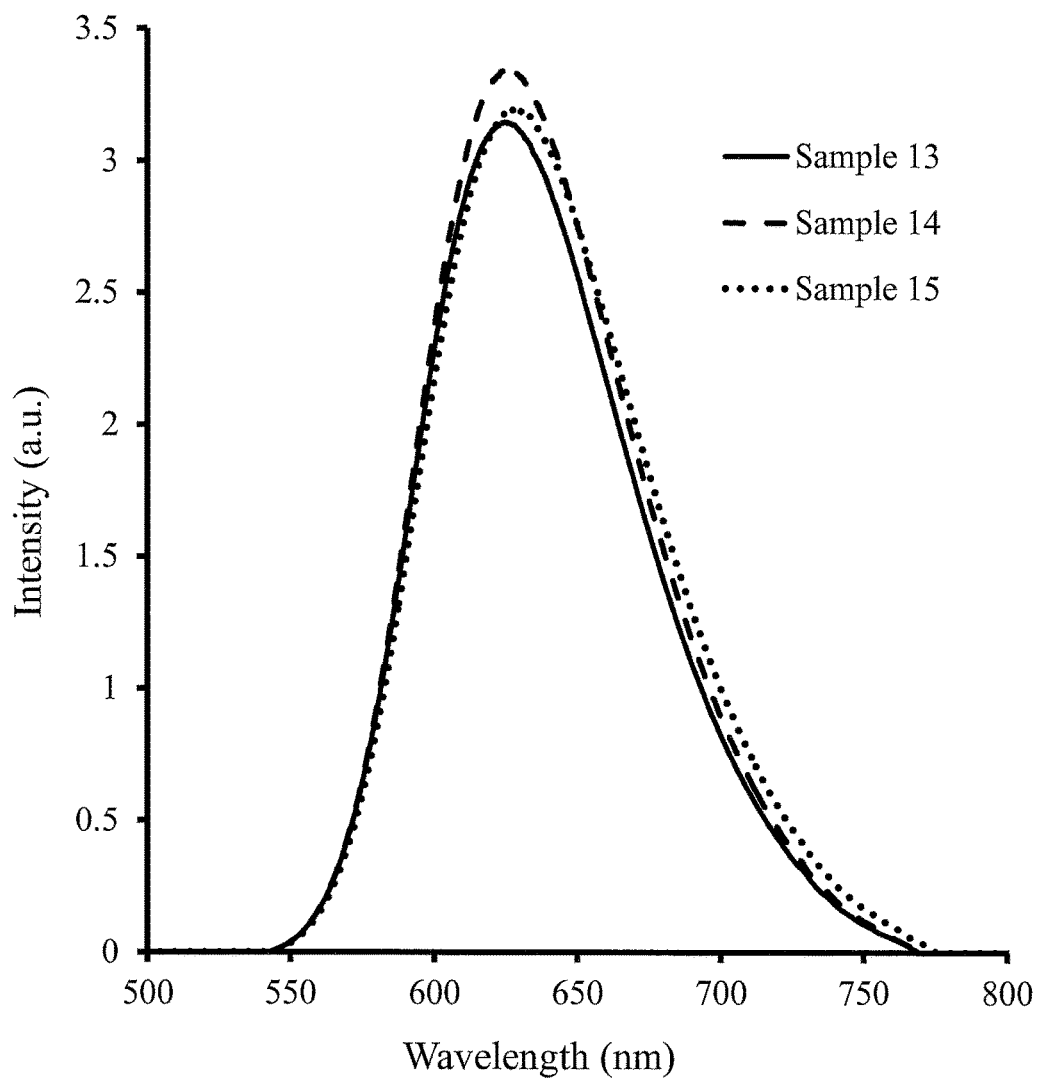
FIG. 4 shows emission spectra of the red-emitting nitride-based calcium-stabilized phosphors Samples 13 through 15, according to some embodiments of the present invention.
Figure 5A:
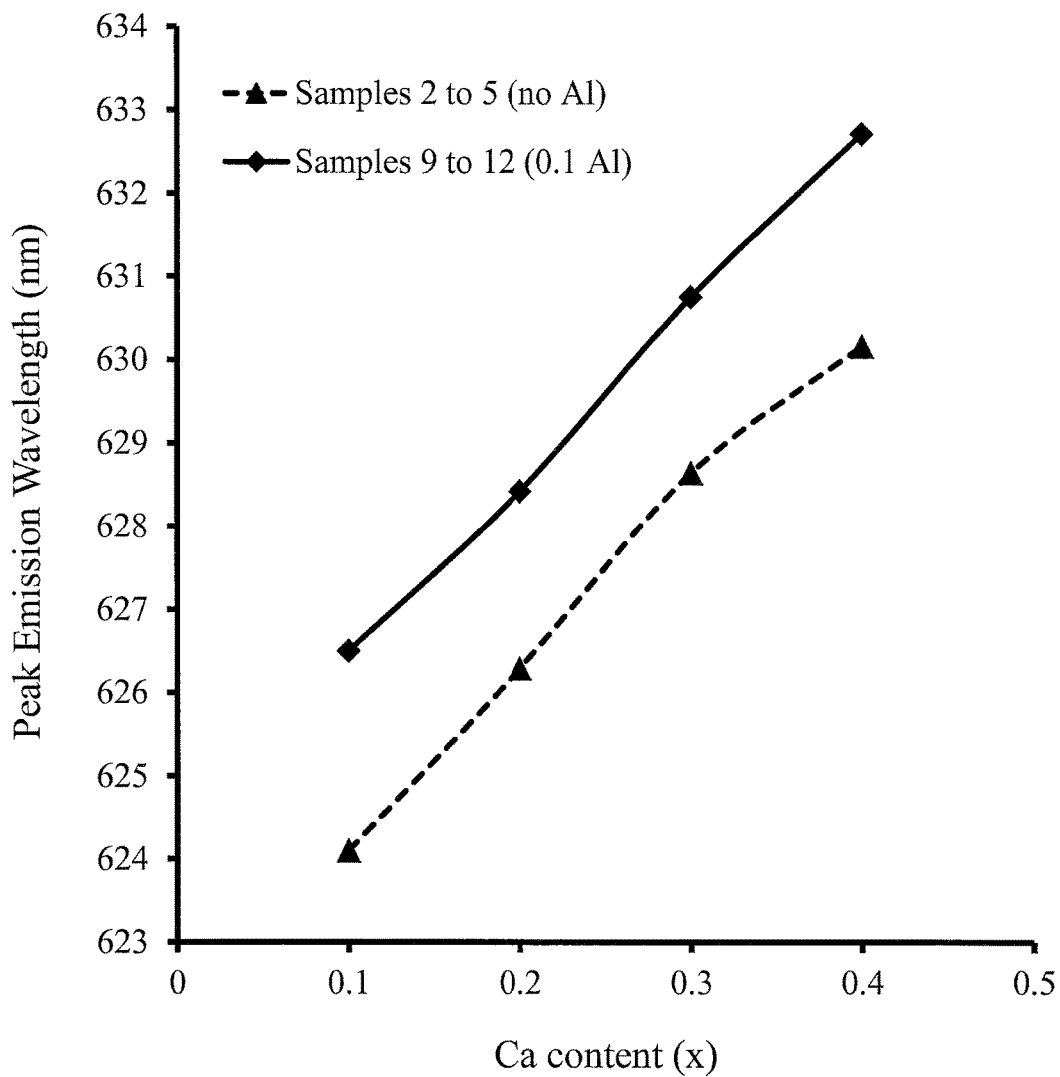
FIGS. 5A-5D show trends with phosphor calcium content of the peak emission wavelength, peak photoluminescence intensity (PL) and CIE x and y chromaticity coordinates, for red-emitting nitride-based calcium-stabilized phosphors Samples 2 through 5 (no aluminum) and 9 through 12 (aluminum containing), according to some embodiments of the present invention.
Figure 5B:
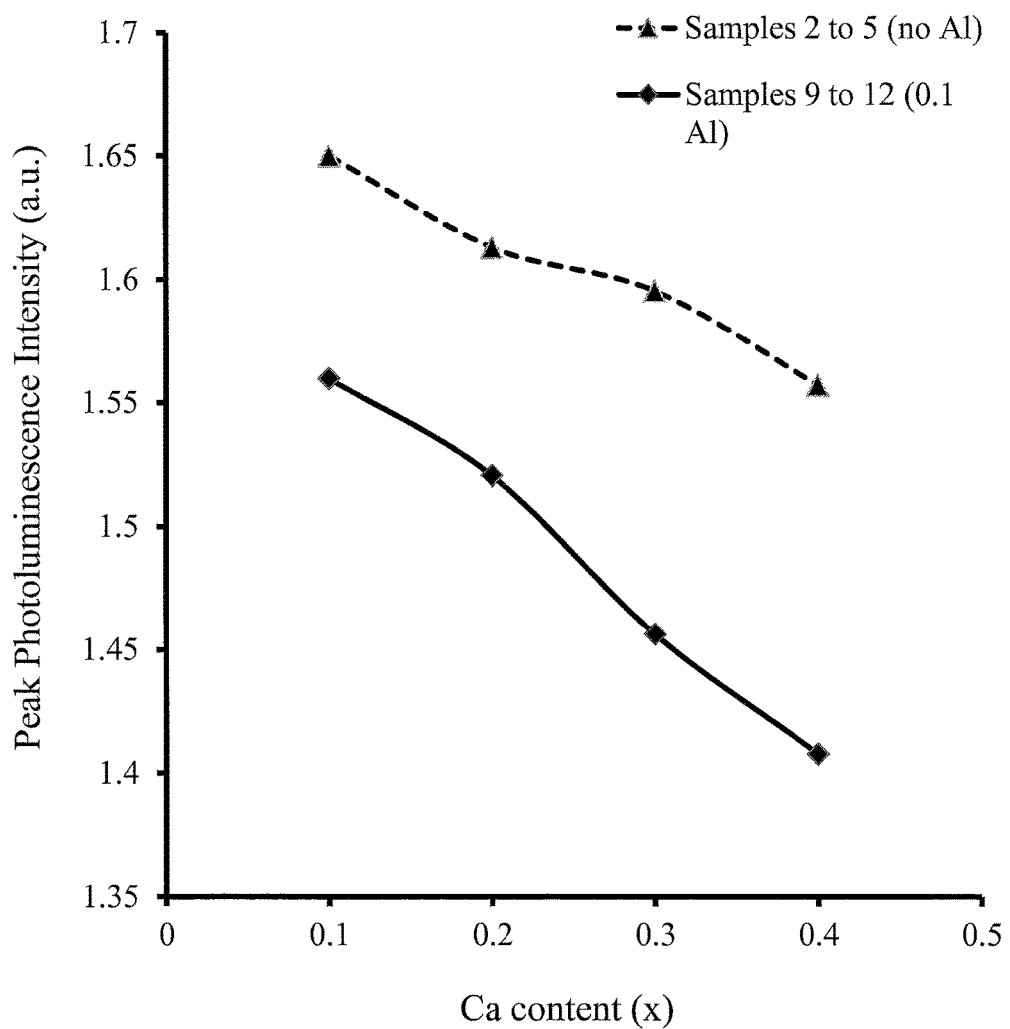
Figure 5C:
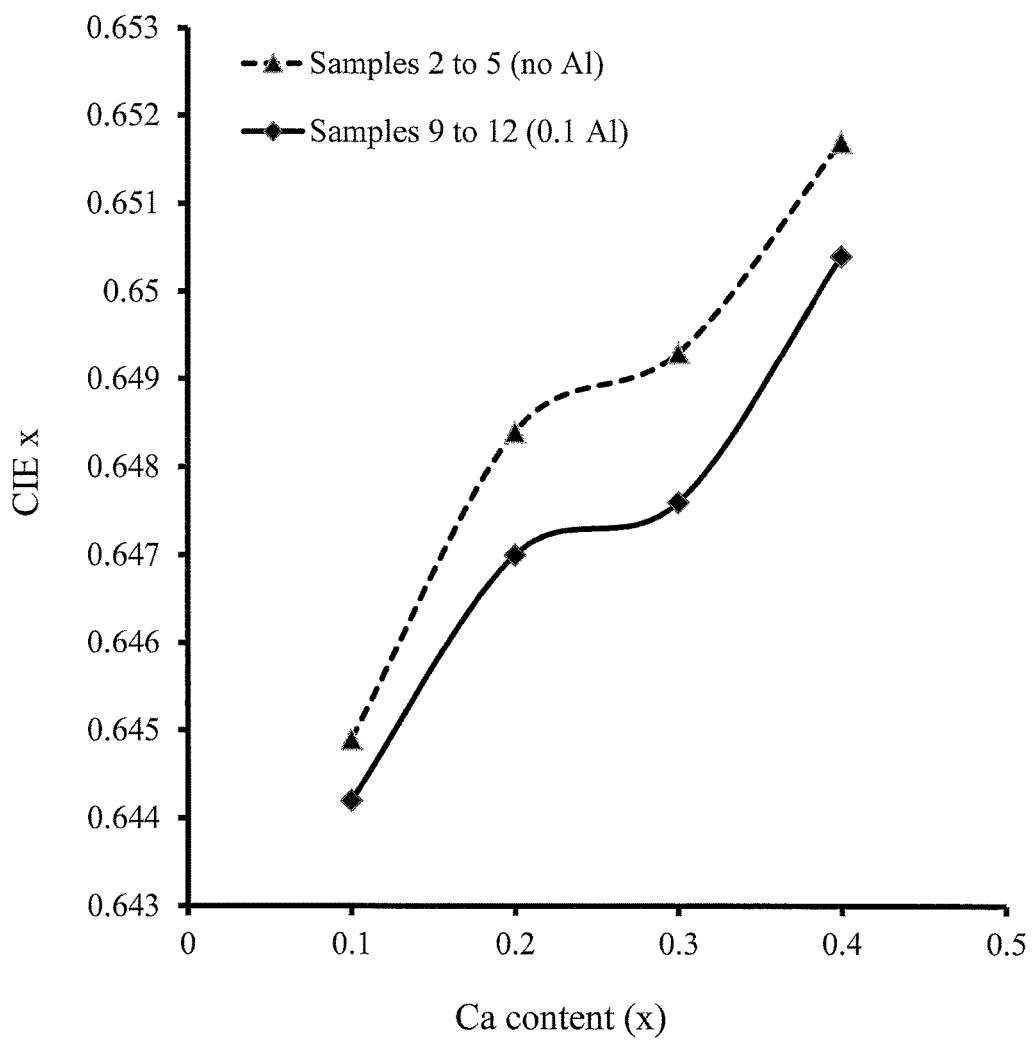
Figure 5D:
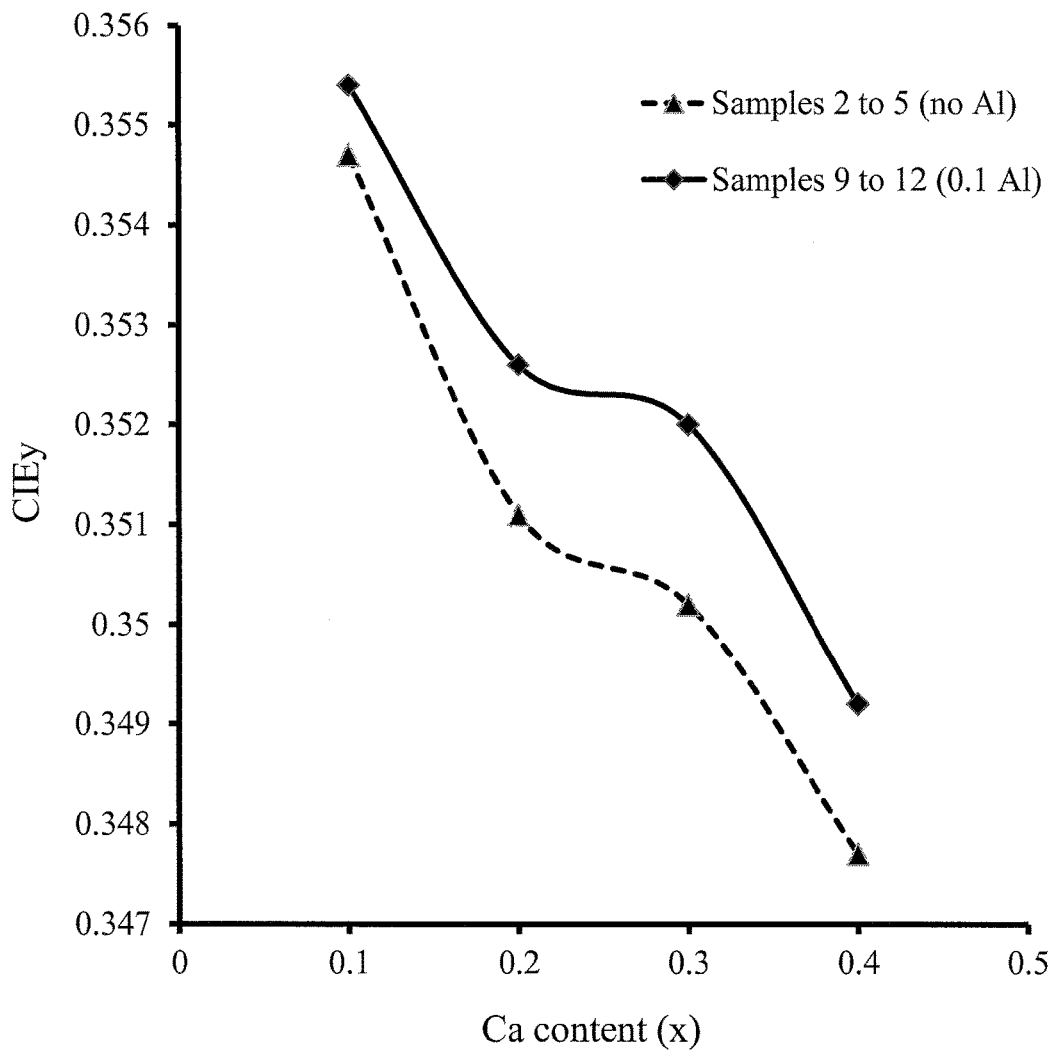
Figure 6A:
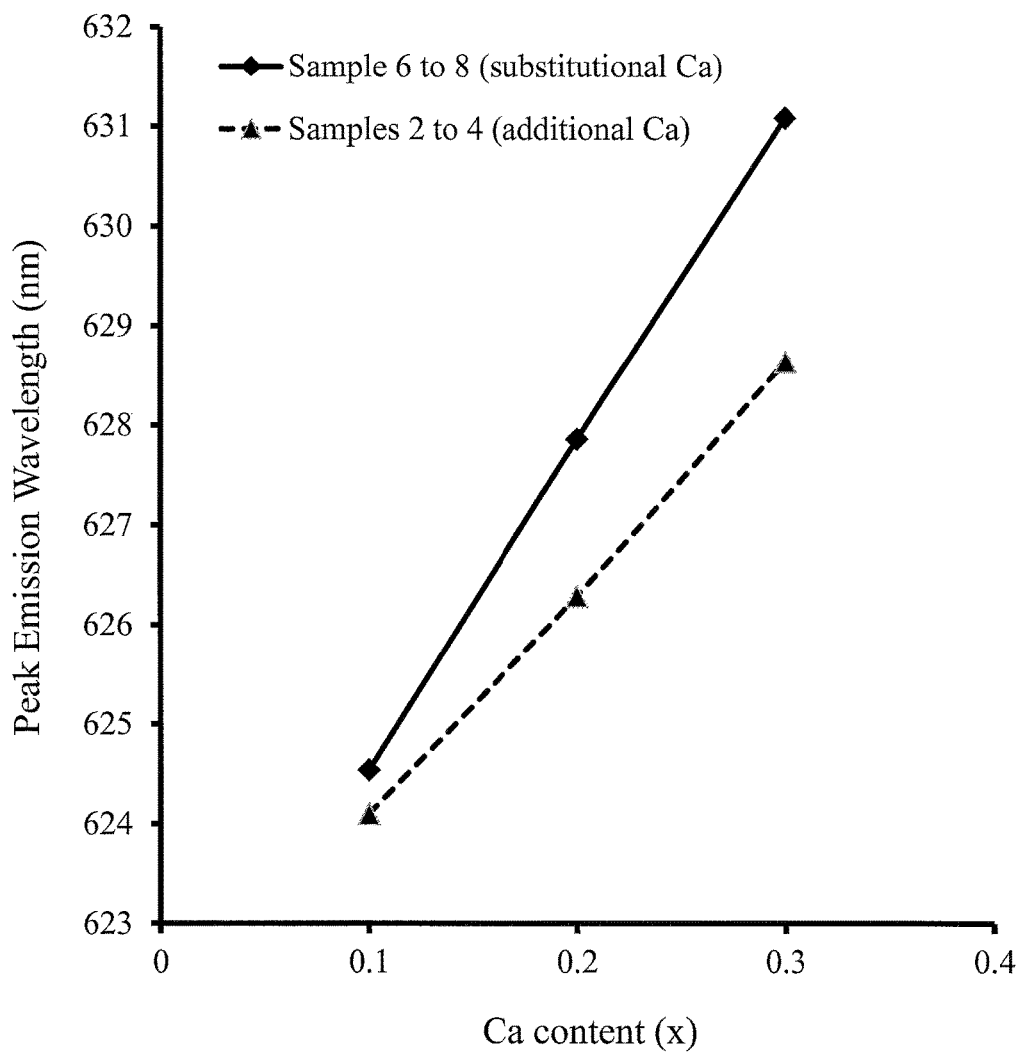
FIGS. 6A-6D show trends with phosphor calcium content of the peak emission wavelength, peak photoluminescence intensity (PL) and CIE x and y chromaticity coordinates, for red-emitting nitride-based calcium-stabilized phosphors Samples 2 through 4 (additional calcium) and 6 through 8 (substitutional calcium), according to some embodiments of the present invention.
Figure 6B:
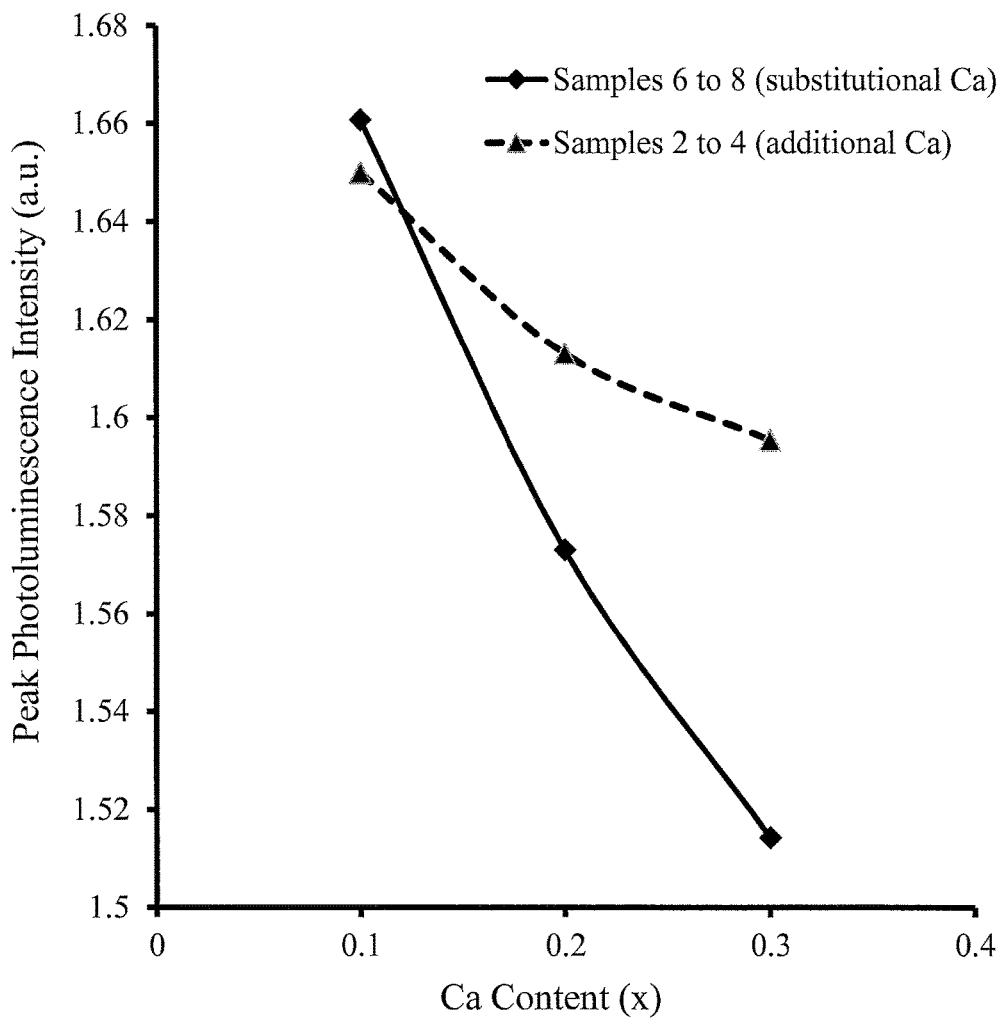
Figure 6C:
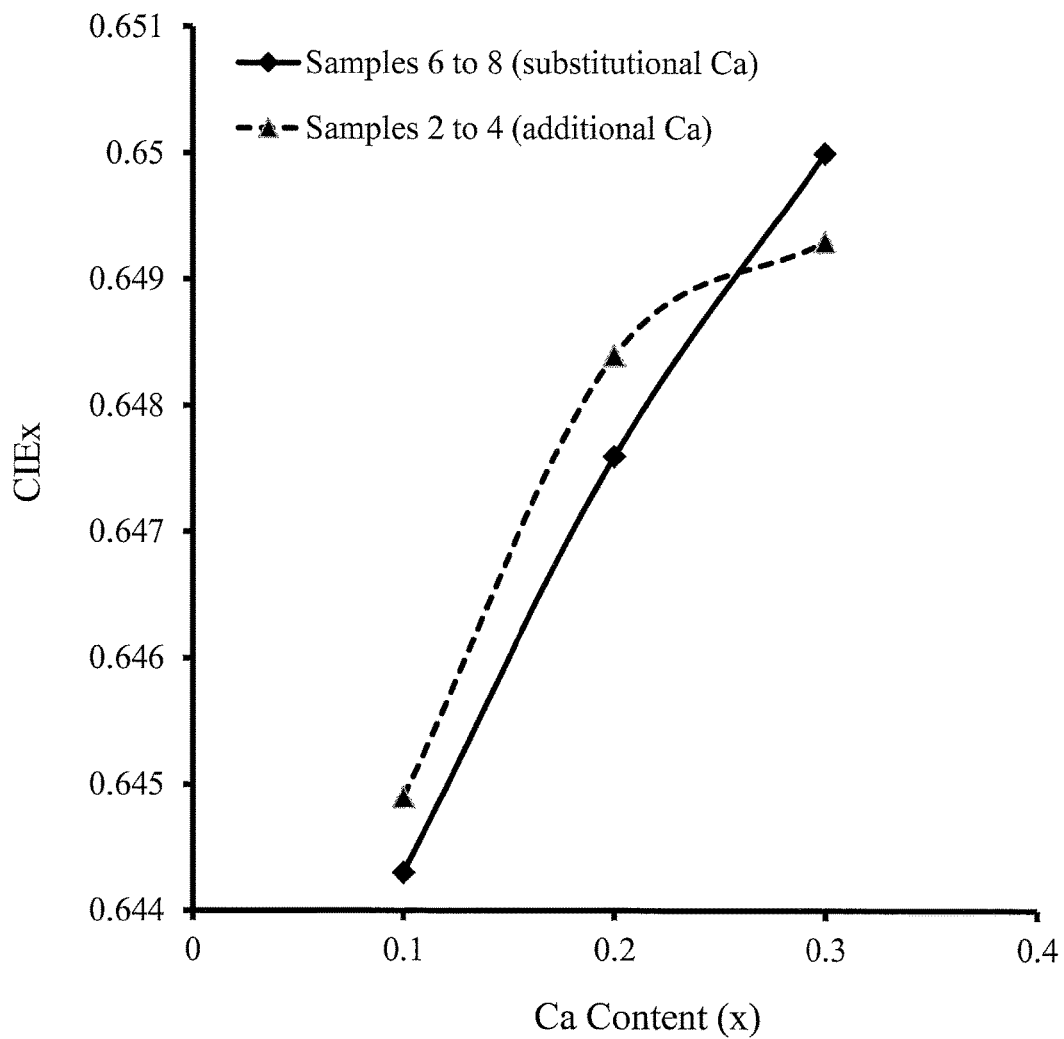
Figure 6D:
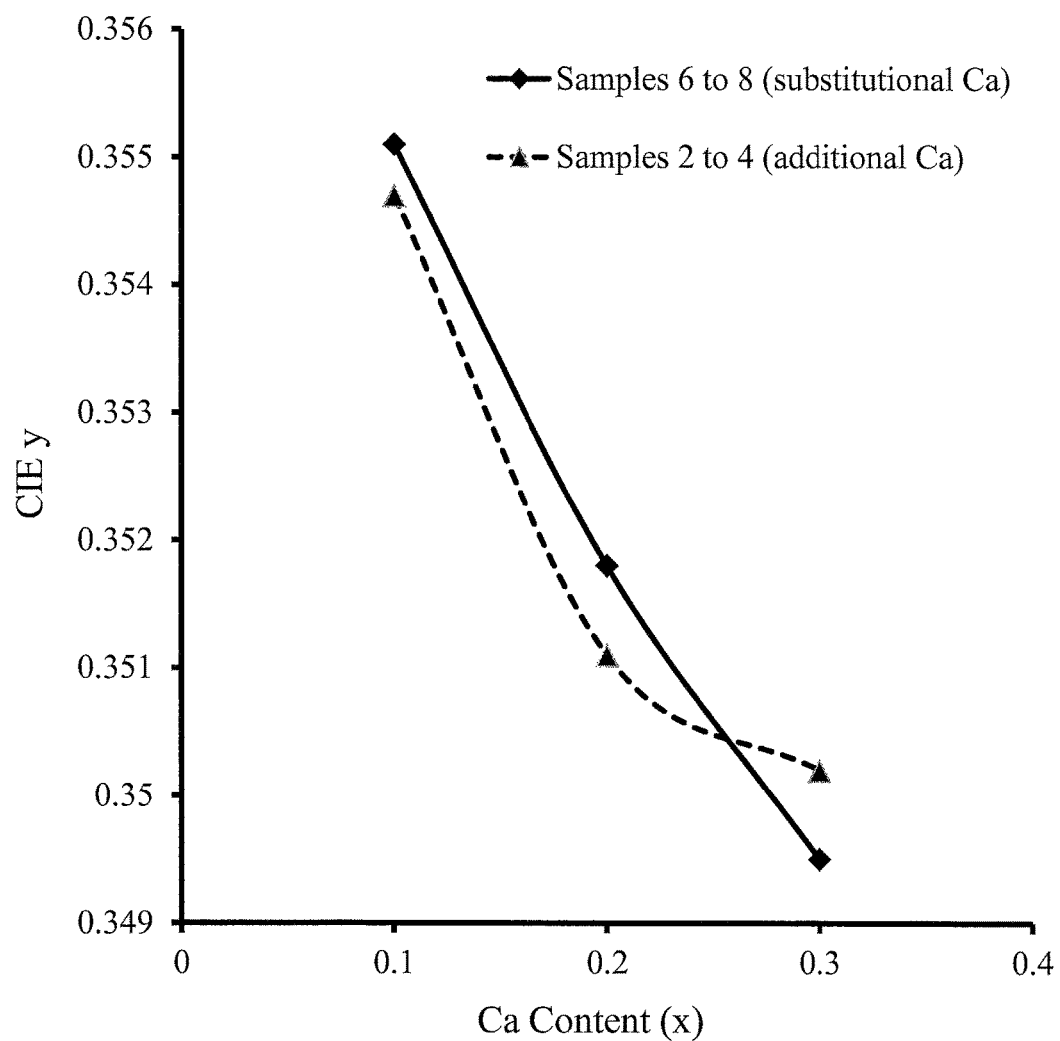
Figure 14:
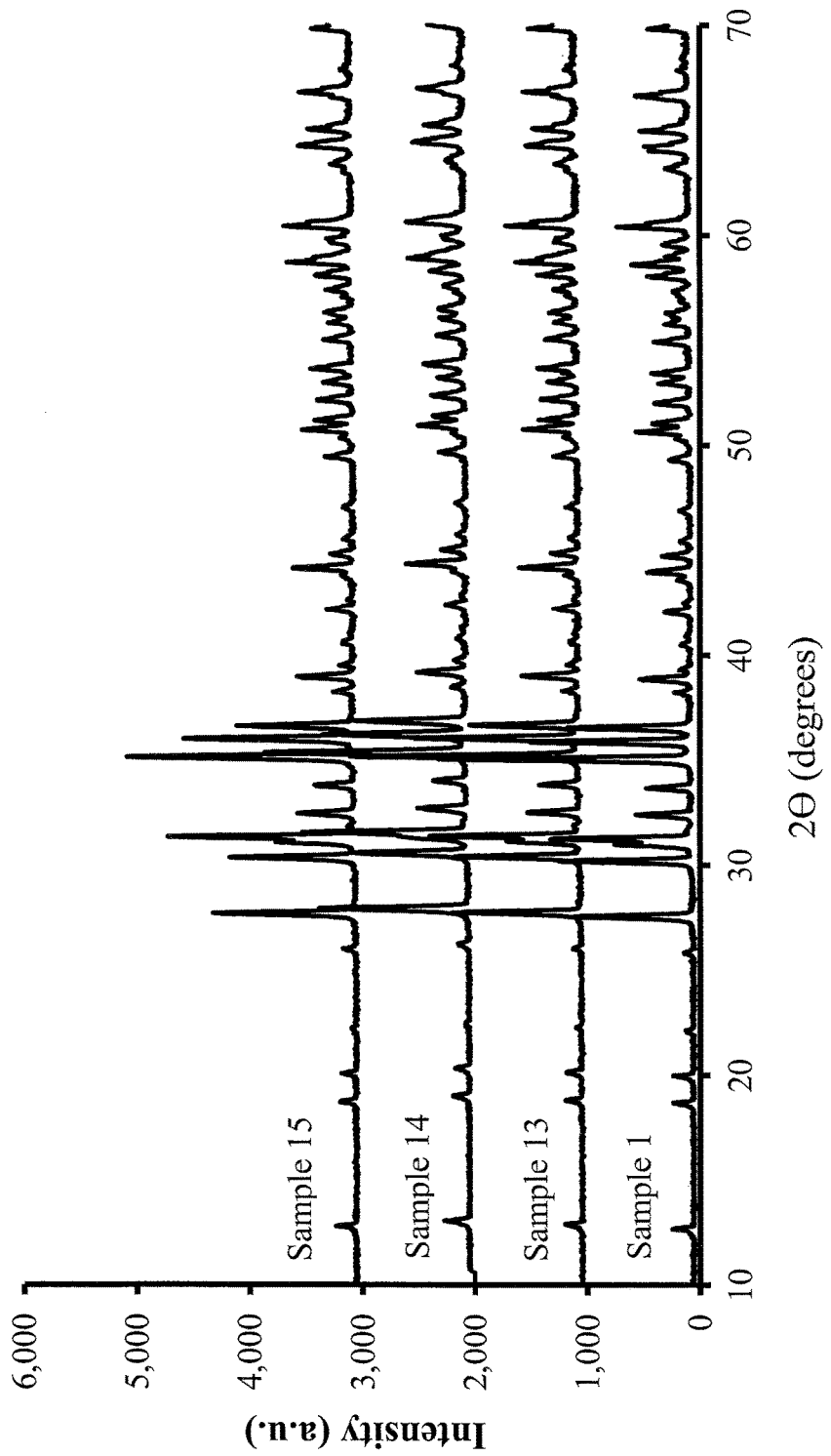
FIG. 14 shows x-ray diffraction patterns of the red-emitting nitride-based calcium-stabilized phosphors Samples 13 through 15, according to some embodiments of the present invention, the XRD pattern for Sample 1 is shown for comparison.

FIG. 4 is the emission spectra of the phosphors from Samples 13 through 15. X-ray diffraction measurements using the $K_\alpha$ line of a Cu target were obtained, and the XRD patterns of Samples 13-15 are shown in FIG. 14.

TABLE 4A

Composition of starting raw materials for Samples 13 through 15

| Compound | $EuCl_3$ | $Sr_3N_2$ | $Ca_3N_2$ | $Si_3N_4$ | AlN |
|---|---|---|---|---|---|
| Sample 13 | 5.166 | 75.622 | 1.186 | 91.28 | 1.968 |
| Sample 14 | 5.166 | 75.622 | 1.976 | 91.28 | 1.968 |
| Sample 15 | 5.166 | 75.622 | 3.592 | 91.28 | 1.968 |

TABLE 4B

Emission Peak wavelength, Intensity and CIE of Samples 13 through 15 with Composition $Ca_xSr_{1.95}Si_{4.88}Al_{0.12}N_8Eu_{0.05}$

| | | | Test Results | | | |
|---|---|---|---|---|---|---|
| Sample | Ca Content, x | Al Content | Emission Peak Wavelength (nm) | Intensity (a.u.) | CIE (x) | CIE (y) |
| 13 | 0.06 (charge balanced) | 0.12 | 625 | 1.66 | 0.6450 | 0.3540 |
| 14 | 0.1 (Ca excess) | 0.12 | 626 | 1.59 | 0.6459 | 0.3538 |
| 15 | 0.2 (Ca excess) | 0.12 | 629 | 1.52 | 0.6478 | 0.3518 |

Those of ordinary skill in the art will appreciate that compositions beyond those specifically described above may be made using the methods described above with some different choices of elements. For example, phosphor compositions may be made which are represented by the chemical formula $M_aSr_bSi_cAl_dN_eEu_f$, wherein: M is at least one of Mg, Ca, Sr, Ba, Y, Li, Na, K and Zn, and $0<a<1.0$; $1.5<b<2.5$; $4.0 \leq c \leq 5.0$; $0 \leq d \leq 1.0$; $7.5<e<8.5$; and $0<f<0.1$; wherein $a+b+f>2+d/v$ and v is the valence of M. Furthermore, phosphor compositions may be made which are represented by the chemical formula $M_xM''_2Si_{5-y}Al_yN_8$:A, wherein: M is Mg, Ca, Sr, Ba, Y, Li, Na, K and Zn, and $x>0$; M' is at least one of Mg, Ca, Sr, Ba, and Zn; $0 \leq y \leq 0.15$; and A is at least one of Eu, Ce, Tb, Pr, and Mn; wherein $x>y/v$ and v is the valence of M, and wherein the phosphors have the general crystalline structure of $M'_2Si_5N_8$:A.

Figure 18:
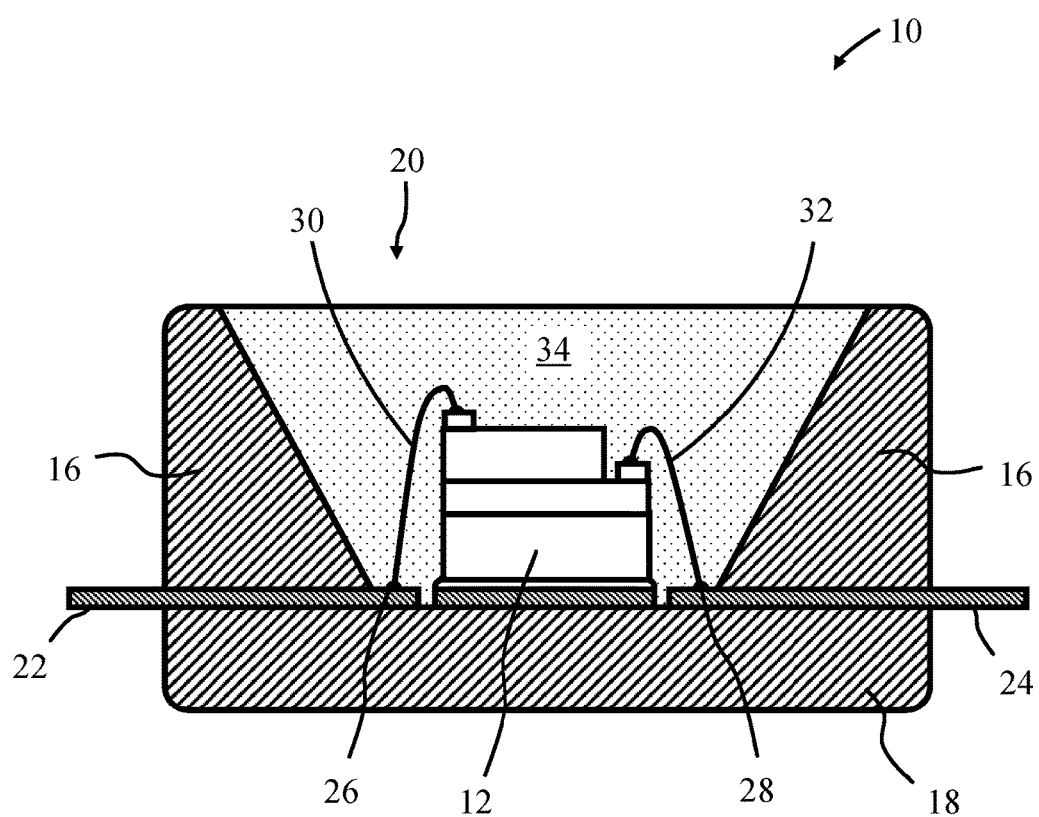
FIG. 18 shows a light emitting device, according to some embodiments of the present invention.

FIG. 18 illustrates a light emitting device, according to some embodiments. The device 10 can comprise a blue light emitting, within the range of 450 nm to 470 nm, GaN (gallium nitride) LED chip 12, for example, housed within a package. The package, which can for example comprise a low temperature co-fired ceramic (LTCC) or high temperature polymer, comprises upper and lower body parts 16, 18. The upper body part 16 defines a recess 20, often circular in shape, which is configured to receive the LED chips 12. The package further comprises electrical connectors 22 and 24 that also define corresponding electrode contact pads 26 and 28 on the floor of the recess 20. Using adhesive or solder, the LED chip 12 can be mounted to a thermally conductive pad located on the floor of the recess 20. The LED chip's electrode pads are electrically connected to corresponding electrode contact pads 26 and 28 on the floor of the package using bond wires 30 and 32 and the recess 20 is completely filled with a transparent polymer material 34, typically a silicone, which is loaded with a mixture of a yellow and/or green phosphor and a red phosphor material of the present invention such that the exposed surfaces of the LED chip 12 are covered by the phosphor/polymer material mixture. To enhance the emission brightness of the device the walls of the recess are inclined and have a light reflective surface.

Figure 19A:
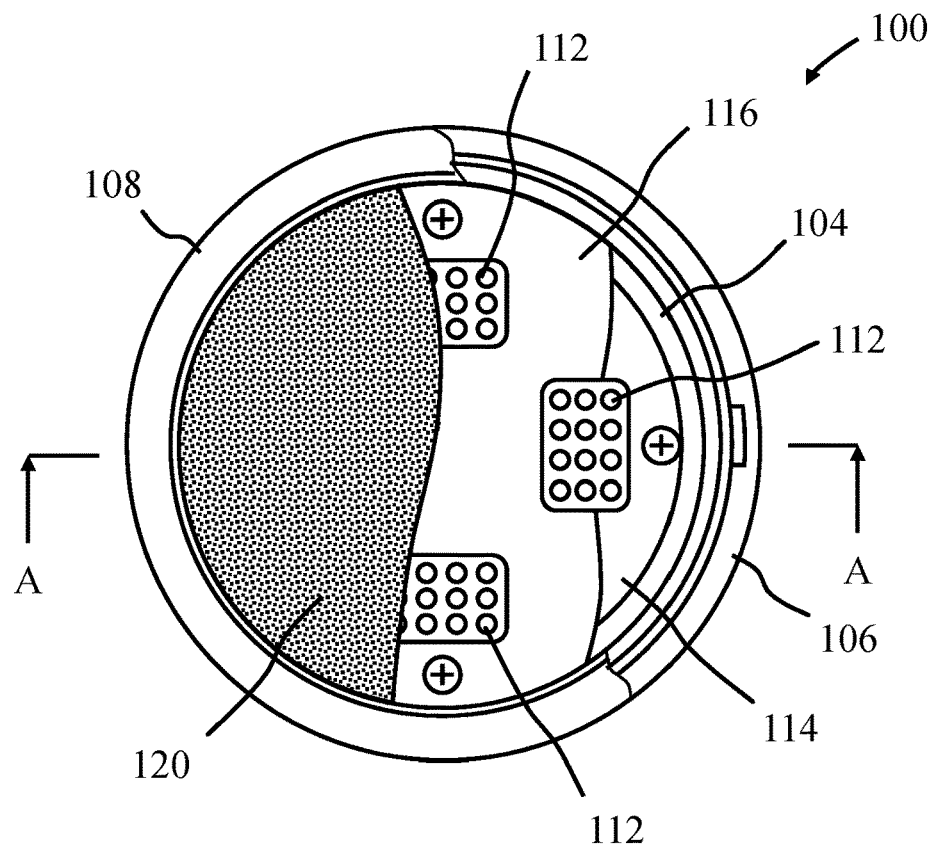
FIGS. 19A & 19B show a solid-state light emitting device, according to some embodiments of the present invention.
Figure 19B:
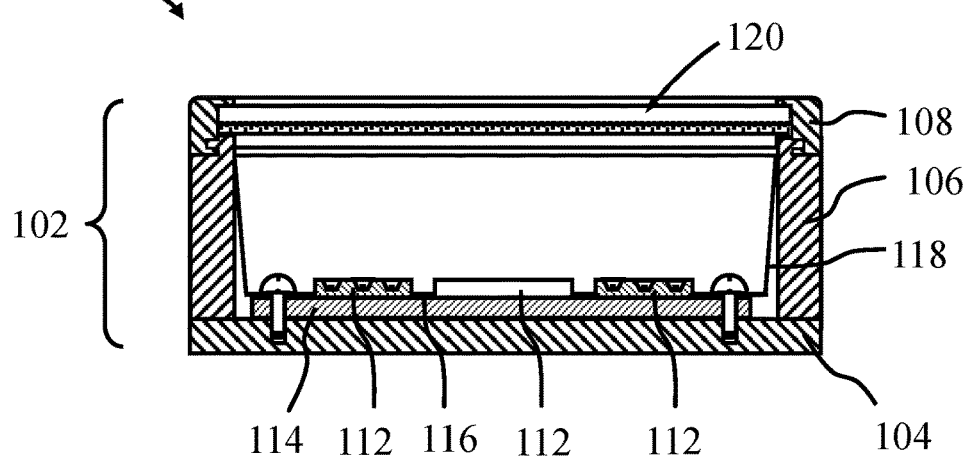

FIGS. 19A and 19B illustrate a solid-state light emitting device, according to some embodiments. The device 100 is configured to generate warm white light with a CCT (Correlated Color Temperature) of approximately 3000K and a luminous flux of approximately 1000 lumens and can be used as a part of a downlight or other lighting fixture. The device 100 comprises a hollow cylindrical body 102 composed of a circular disc-shaped base 104, a hollow cylindrical wall portion 106 and a detachable annular top 108. To aid in the dissipation of heat, the base 104 is preferably fabricated from aluminum, an alloy of aluminum or any material with a high thermal conductivity. The base 104 can be attached to the wall portion 106 by screws or bolts or by other fasteners or by means of an adhesive.

The device 100 further comprises a plurality (four in the example illustrated) of blue light emitting LEDs 112 (blue LEDs) that are mounted in thermal communication with a circular-shaped MCPCB (metal core printed circuit board) 114. The blue LEDs 112 can comprise a ceramic packaged array of twelve 0.4 W GaN-based (gallium nitride-based) blue LED chips that are configured as a rectangular array 3 rows by 4 columns.

To maximize the emission of light, the device 100 can further comprise light reflective surfaces 116 and 118 that respectively cover the face of the MCPCB 114 and the inner curved surface of the top 108. The device 100 further comprises a photoluminescent wavelength conversion component 120 that is operable to absorb a proportion of the blue light generated by the LEDs 112 and convert it to light of a different wavelength by a process of photoluminescence. The emission product of the device 100 comprises the combined light generated by the LEDs 112 and the photoluminescent wavelength conversion component 120. The wavelength conversion component is positioned remotely to the LEDs 112 and is spatially separated from the LEDs. In this patent specification "remotely" and "remote" means in a spaced or separated relationship. The wavelength conversion component 120 is configured to completely cover the housing opening such that all light emitted by the lamp passes through the component 120. As shown the wavelength conversion component 120 can be detachably mounted to the top of the wall portion 106 using the top 108 enabling the component and emission color of the lamp to be readily changed.

Figure 20:
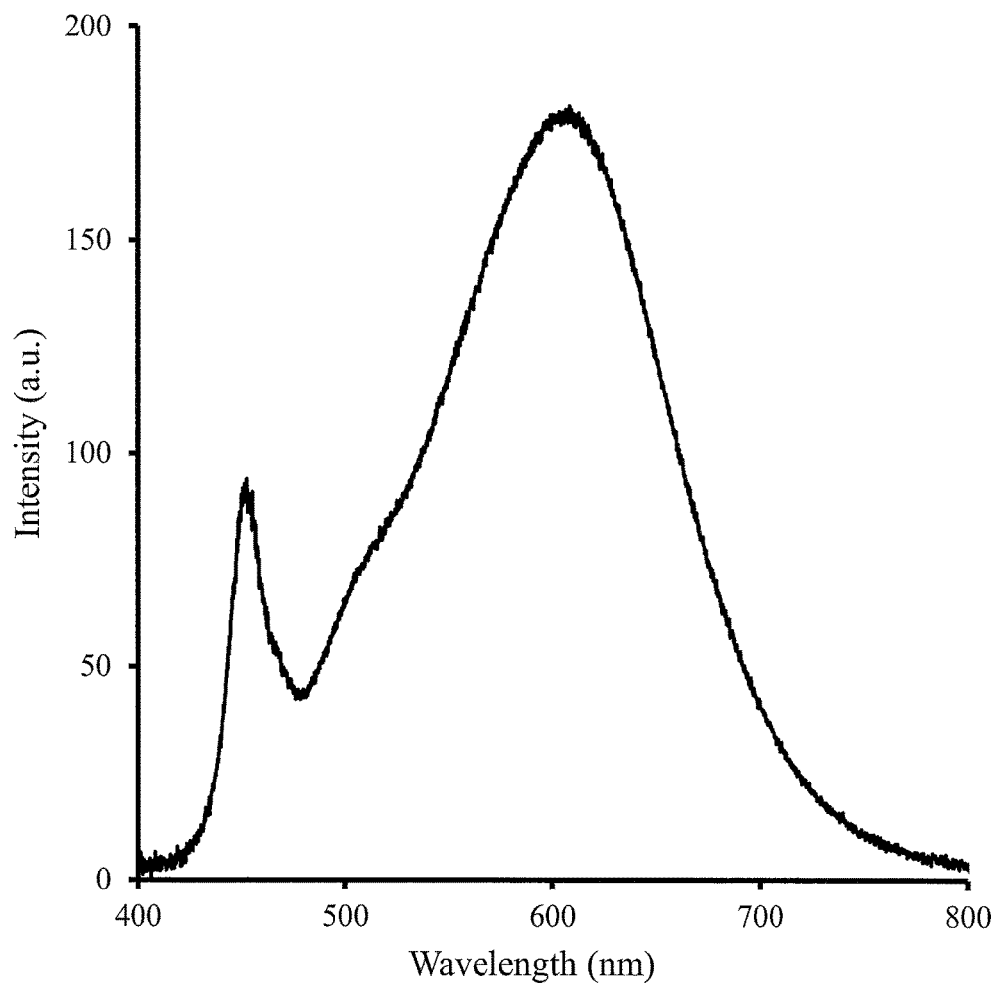
FIG. 20 shows the emission spectrum from a white LED (3000K) comprising a blue InGaN LED, a red phosphor having the composition of Sample 14, and a yellow/green phosphor, according to some embodiments of the present invention.

FIG. 20 shows the emission spectrum from a white light emitting device, such as described above with reference to FIGS. 18, 19A & 19B, comprising a blue-emitting InGaN LED, a red phosphor having the composition of Sample 14, and one or more yellow/green phosphors with peak emission within the range of 500 mn to 580 mn, such as a phosphor described in commonly-owned U.S. Pat. No. 8,529,791 and U.S. Pat. No. 8,475,683, both incorporated by reference herein in their entirety. In further embodiments, the yellow/green phosphor may be a silicate. Yet furthermore, the white LED may further comprise another phosphor as may be needed to achieve a desired emission spectrum, for example an orange aluminate.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A calcium-stabilized red-emitting phosphor comprising Ca, Sr, Si, Al, N and Eu, wherein said red-emitting phosphor absorbs radiation at a wavelength ranging from about 200 nm to about 550 nm and emits light with a photoluminescence peak emission wavelength greater than 620.0 nm, wherein said red-emitting phosphor has the general crystalline structure of $Sr_2Si_5N_8$:Eu with Ca and Al incorporated therein, and wherein said red-emitting phosphor is configured such that under excitation by a blue LED the reduction in photoluminescent intensity after 800 hours of aging at about 85° C. and about 85% humidity is no greater than about 15%.

2. The calcium-stabilized red-emitting phosphor of claim 1, further comprising at least one of F, Cl, Br and O.

3. The calcium-stabilized red-emitting phosphor of claim 1, wherein said red-emitting phosphor is $Eu_{0.05}Ca_{0.2}Sr_{1.95}Si_{4.9}Al_{0.1}N_8$.

4. The calcium-stabilized red-emitting phosphor of claim 1, wherein said red-emitting phosphor has chromaticity coordinates CIE (x) of 0.6470 and CIE (y) of 0.3526.

5. The calcium-stabilized red-emitting phosphor of claim 1, wherein said red-emitting phosphor is $Eu_{0.05}Ca_{0.2}Sr_{1.95}Si_{4.88}Al_{0.12}N_8$.

6. The calcium-stabilized red-emitting phosphor of claim 1, wherein said red-emitting phosphor has chromaticity coordinates CIE (x) of 0.6478 and CIE (y) of 0.3518.

7. A calcium-stabilized red-emitting phosphor comprising Ca, Sr, Si, Al, N and Eu, wherein said red-emitting phosphor absorbs radiation at a wavelength ranging from about 200 nm to about 550 nm and emits light with a photoluminescence peak emission wavelength greater than 620.0 nm, wherein said red-emitting phosphor has the general crystalline structure of $Sr_2Si_5N_8$:Eu with Ca and Al incorporated therein, and wherein said red-emitting phosphor is configured such that the deviation in chromaticity coordinates CIE $\Delta x$ and CIE $\Delta y$ after 800 hours of aging at about 85° C. and about 85% relative humidity is less than or equal to about 0.015 for each coordinate.

8. The calcium-stabilized red-emitting phosphor of claim 7, wherein the deviation in chromaticity coordinates CIE $\Delta x$ and CIE $\Delta y$ is less than or equal to about 0.005 for each coordinate.

9. The calcium-stabilized red-emitting phosphor of claim 7, further comprising at least one of F, Cl, Br and O.

10. The calcium-stabilized red-emitting phosphor of claim 7, wherein said red-emitting phosphor is $Eu_{0.05}Ca_{0.2}Sr_{1.95}Si_{4.9}Al_{0.1}N_8$.

11. The calcium-stabilized red-emitting phosphor of claim 7, wherein said red-emitting phosphor has chromaticity coordinates CIE (x) of 0.6470 and CIE (y) of 0.3526.

12. The calcium-stabilized red-emitting phosphor of claim 7, wherein said red-emitting phosphor is $Eu_{0.05}Ca_{0.2}Sr_{1.95}Si_{4.88}Al_{0.12}N_8$.

13. The calcium-stabilized red-emitting phosphor of claim 7, wherein said red-emitting phosphor has chromaticity coordinates CIE (x) of 0.6478 and CIE (y) of 0.3518.

14. A white light emitting device comprising:
a solid state excitation source with emission wavelength within a range from 200 nm to 480 nm;
a calcium-stabilized red-emitting phosphor according to claim 1, said red-emitting phosphor being configured to absorb excitation radiation from said excitation source and to emit light having a peak emission wavelength in the range from 620 nm to about 650 nm; and a yellow/green-emitting phosphor having a peak emission wavelength in the range from about 500 nm to about 580 nm.

15. The white light emitting device of claim 14, wherein said calcium-stabilized red-emitting phosphor is configured to absorb excitation radiation from said excitation source and to emit light having a peak emission wavelength in the range from about 624 nm to about 632 nm.

* * * * *